United States Patent
Puranic et al.

(10) Patent No.: US 12,307,173 B2
(45) Date of Patent: May 20, 2025

(54) EXTRACTING TEMPORAL SPECIFICATIONS OF FEATURES FOR FUNCTIONAL COMPATIBILITY AND INTEGRATION WITH OEMs

(71) Applicant: Toyota Motor Engineering & Manufacturing North America, Inc., Erlanger, KY (US)

(72) Inventors: Aniruddh G. Puranic, Mountain View, CA (US); Akihito Nakamura, Toyota (JP); BaekGyu Kim, Mountain View, CA (US)

( * ) Notice: Subject to any disclaimer, the term of this patent is extended or adjusted under 35 U.S.C. 154(b) by 903 days.

(21) Appl. No.: 16/536,247

(22) Filed: Aug. 8, 2019

(65) Prior Publication Data
US 2021/0042394 A1 Feb. 11, 2021

(51) Int. Cl.
*G06F 30/20* (2020.01)
*G06F 30/15* (2020.01)

(52) U.S. Cl.
CPC .............. *G06F 30/20* (2020.01); *G06F 30/15* (2020.01)

(58) Field of Classification Search
CPC .......... G06F 30/20; G06F 30/15; G06F 30/25; G06F 30/27; G06F 30/28; G06F 2111/00–2119/22; B60W 30/08; B60W 50/045; B60W 2050/0062; G01M 17/00
USPC .......................................................... 703/6
See application file for complete search history.

(56) References Cited

U.S. PATENT DOCUMENTS

| | | |
|---|---|---|
| 9,081,900 B2 * | 7/2015 | Deshmukh .............. G06F 30/00 |
| 9,459,840 B1 | 10/2016 | Yu et al. |
| 2014/0109036 A1 * | 4/2014 | Desmukh ............ G06F 11/3692 717/104 |
| 2015/0242541 A1 * | 8/2015 | Cerny ................. G06F 30/3323 716/106 |
| 2017/0249202 A1 | 8/2017 | Nguyen et al. |
| 2020/0125472 A1 * | 4/2020 | Arechiga Gonzalez ..................... G06F 11/3461 |
| 2020/0320233 A1 * | 10/2020 | Naderhirn ............... G06F 30/20 |

OTHER PUBLICATIONS

Korssen, T. et. al. "Systematic model-based design and implementation of supervisors for advanced driver assistance systems." ( IEEE, 2017) IEEE Transactions on Intelligent Transportation Systems 19, Feb. 2018, No. 2: 533-544. 10.1109/TITS.2017.2776354 (Year: 2017).*

(Continued)

*Primary Examiner* — John E Johansen
(74) *Attorney, Agent, or Firm* — Burbage Law, P.C.; Jon-Michael Burbage

(57) ABSTRACT

The disclosure includes embodiments for testing a third-party feature for compatibility and integration with an Original Equipment Manufacturer (OEM) vehicle design. A method includes modifying a vehicle design to include a third-party feature, where modifying the vehicle design generates a modified vehicle design. The method includes executing a simulation based on the modified vehicle design. The method includes extracting, from the simulation, a third-party temporal logic of the third-party feature. The method includes determining, based on the third-party temporal logic, an indication of whether the third-party feature is compliant with the vehicle design.

20 Claims, 11 Drawing Sheets

(56) References Cited

OTHER PUBLICATIONS

Kaiser, Bernhard. et. al. "Contract-based design of embedded systems integrating nominal behavior and safety." (CSIMQ, 2015) Complex Systems Informatics and Modeling Quarterly 4, Oct. 2015. pp. 66-91. http://dx.doi.org/10.7250/csimq.2015-4.05 (Year: 2015).*

Nguyen, Thang, and Dejan Ničković. "Assertion-based monitoring in practice-checking correctness of an automotive sensor interface." (Science Direct, 2016) Science of Computer Programming 118: 40-59. http://dx.doi.org/10.1016/j.scico.2015.11.002 (Year: 2016).*

Kane, Aaron. et. al. "Monitor based oracles for cyber-physical system testing: Practical experience report." (IEEE, 2014) In 2014 44th annual ieee/ifip international conference on dependable systems and networks, pp. 148-155. DOI 10.1109/DSN.2014.28 (Year: 2014).*

Storcheus, Dmitry, Afshin Rostamizadeh, and Sanjiv Kumar. "A survey of modern questions and challenges in feature extraction." In Feature Extraction: Modern Questions and Challenges, pp. 1-18. PMLR, 2015. (Year: 2015).*

Khosrowjerdi, Hojat, Karl Meinke, and Andreas Rasmusson. "Automated behavioral requirements testing for automotive ECU applications." In Proceedings of the 5th International Workshop on Model Based Safety Analysis. In: IMBSA. 2017. (Year: 2017).*

Khosrowjerdi, H., Meinke, K., & Rasmusson, A. (2017). Learning-based testing for safety critical automotive applications. In Model-Based Safety and Assessment: 5th International Symposium, IMBSA 2017, Trento, Italy, Sep. 11-13, 2017, Proceedings 5 (pp. 197-211). Springer International Publishing. (Year: 2017).*

Scheickl, Oliver. "Timing constraints in distributed development of automotive real-time systems." PhD diss., Technische Universität München, 2011. (Year: 2011).*

Brunel, J-Y., Marco Di Natale, Alberto Ferrari, Paolo Giusto, and Luciano Lavagno. "Softcontract: an assertion-based software development process that enables design-by-contract." In Proceedings Design, Automation and Test in Europe Conference and Exhibition, vol. 1, pp. 358-363. IEEE, 2004. (Year: 2004).*

Akazaki, Takumi, and Ichiro Hasuo. "Time robustness in MTL and expressivity in hybrid system falsification." In International Conference on Computer Aided Verification, pp. 356-374. Cham: Springer International Publishing, 2015. (Year: 2015).*

Banerjee, Ansuman, et. al. "Can Semi-Formal be Made More Formal?." In Next Generation Design and Verification Methodologies for Distributed Embedded Control Systems: Proceedings of the GM R&D Workshop, Bangalore, India, Jan. 2007, pp. 193-211. Dordrecht: Springer Netherlands, 2007. (Year: 2007).*

Liu, Lingyi, David Sheridan, Viraj Athavale, and Shobha Vasudevan. "Automatic generation of assertions from system level design using data mining." In Ninth ACM/IEEE International Conference on Formal Methods and Models for Codesign (MEMPCODE2011), pp. 191-200. IEEE, 2011. (Year: 2011).*

Danese, Alessandro, Tara Ghasempouri, and Graziano Pravadelli. "Automatic extraction of assertions from execution traces of behavioural models." In 2015 Design, Automation & Test in Europe Conference & Exhibition (DATE), pp. 67-72. IEEE, 2015. (Year: 2015).*

Jin, Xiaoqing, Alexandre Donzé, Jyotirmoy V. Deshmukh, and Sanjit A. Seshia. "Mining requirements from closed-loop control models." In Proceedings of the 16th international conference on Hybrid systems: computation and control, pp. 43-52. 2013. (Year: 2013).*

Sailer, Andreas, Michael Deubzer, Gerald Lüttgen, and Jürgen Mottok. "Comparing trace recordings of automotive real-time software." In Proceedings of the 25th International Conference on Real-Time Networks and Systems, pp. 118-127. 2017. (Year: 2017).*

Andersson, Johan. "Modeling the temporal behavior of complex embedded systems: a reverse engineering approach." PhD diss., Malardalen University Press Licentiate Theses. No. 52. Department of Computer Science and Engineering, 2005. (Year: 2005).*

Sandiovanni-Vincentelli, Alberto et al., "Taming Dr. Frankenstein: Contract-based design for cyber-physical systems," European journal of control 18.3 (2012), pp. 217-238.

Watanabe, Kosuke et al., "Runtime monitoring for safety of intelligent vehicles," Proceedings of the 55th Annual Design Automation Conference, 2018, 6 pages.

Bocovich, Cecylia et al., "Variable-specific resolutions for feature interactions," Proceedings of the 22nd ACM SIGSOFT International Symposium on Foundations of Software Engineering, 2014, 11 pages.

Benveniste, Albert et al., "Contracts for system design," Foundations and Trends® in Electronic Design Automation 12.2-3 (2018), 124-400.

Nguyen, Thang et al., "Assertion-based monitoring in practice-checking correctness of an automotive sensor interface," Science of Computer Programming 118 (2016), 40-59.

Vyatkin, Valeriy, "Software engineering in industrial automation: State-of-the-art review," IEEE Transactions on Industrial Informatics 9.3 (2013), 1234-1249.

* cited by examiner

Table 1: Example types of data in a feature

| Type | Function | Examples | Example Simulation Data |
|---|---|---|---|
| Sensors | Distances | LIDAR, RADAR, etc. | Range of real numbers |
| | Images | Cameras | CIFAR, ImageNet, COCO datasets, etc. |
| | Videos | Cameras | KITTI, Youtube datasets, etc. |
| Controllers | Control Outputs | Adaptive Cruise Controller (ACC), ECUs | Range of real numbers |
| Communications | Location | GPS | Map data, communication protocols, etc. |

Figure 7A

Table 2: Example tools for formal language definition, simulation and verification

| Name | Description |
|---|---|
| Breach | A simulation-based design of dynamical cyber-physical and hybrid systems. |
| STaLiRo | A tool for temporal logic falsification of hybrid cyber-physical systems. |
| ST-Lib | A library for specifying and classifying model behaviors. |

Figure 7B

EXTRACTING TEMPORAL SPECIFICATIONS OF FEATURES FOR FUNCTIONAL COMPATIBILITY AND INTEGRATION WITH OEMs

BACKGROUND

The specification relates to testing a third-party feature for compatibility and integration with a vehicle design provided by an Original Equipment Manufacturer ("OEM" if singular, "OEMs" if plural).

With an advancement of automotive technologies such as Vehicle-to-Everything (V2X) communications, edge computing and in-vehicle features, etc., third-party entities may develop their own technologies, products or features to be integrated into vehicles. In some scenarios, these third-party entities may not be OEMs of the vehicles. The OEMs may partially depend on these third-party technologies, products or features to enhance performance or driving experience of the vehicles. In this case, the OEMs need to test these third-party technologies, products, or features before integrating them into the vehicles.

SUMMARY

One general aspect of embodiments described herein includes a computer program product including a non-transitory memory of a computer system storing computer-executable code that, when executed by a processor, causes the processor to: execute a first simulation based on a vehicle design that includes an OEM feature; extract, from the first simulation, an OEM temporal logic of the OEM feature; modify the vehicle design to include a third-party feature, where modifying the vehicle design generates a modified vehicle design; execute a second simulation based on the modified vehicle design; extract, from the second simulation, a third-party temporal logic of the third-party feature; and determine, based on the third-party temporal logic and the OEM temporal logic, an indication of whether the third-party feature is compliant with the OEM feature in the vehicle design. Other embodiments of this aspect include corresponding computer systems, apparatus, and computer programs recorded on one or more computer storage devices, each configured to perform the actions of the methods.

Implementations may include one or more of the following features. The computer program product where the vehicle design includes a design for an autonomous vehicle. The computer program product where the first simulation includes a first virtualized version of a vehicle consistent with the vehicle design, and the second simulation includes a second virtualized version of the vehicle consistent with the modified vehicle design. The computer program product where the third-party feature includes a component of a vehicle whose design is described by the vehicle design. Implementations of the described techniques may include hardware, a method or process, or computer software on a computer-accessible medium.

One general aspect includes a method, including: modifying a vehicle design to include a third-party feature, where modifying the vehicle design generates a modified vehicle design; executing a simulation based on the modified vehicle design; extracting, from the simulation, a third-party temporal logic of the third-party feature; and determining, based on the third-party temporal logic, an indication of whether the third-party feature is compliant with the vehicle design. Other embodiments of this aspect include corresponding computer systems, apparatus, and computer programs recorded on one or more computer storage devices, each configured to perform the actions of the methods.

Implementations may include one or more of the following features. The method where the vehicle design includes a design for an autonomous vehicle. The method where the simulation includes a virtualized version of a vehicle consistent with the modified vehicle design. The method where the third-party feature includes a component of a vehicle whose design is described by the vehicle design. The method where the component includes an Advanced Driver Assistance System (ADAS system). The method where the component includes a vehicle safety system. The method where the component includes an autonomous driving system. The method where determining, based on the third-party temporal logic, the indication of whether the third-party feature is compliant with the vehicle design includes: determining whether the third-party temporal logic is compatible with an OEM temporal logic of an OEM feature included in the vehicle design; and responsive to determining that the third-party temporal logic is compatible with the OEM temporal logic, generating the indication indicating that the third-party feature is compliant with the OEM feature. Implementations of the described techniques may include hardware, a method or process, or computer software on a computer-accessible medium.

One general aspect includes a system including a computer system including a non-transitory memory storing computer code which, when executed by the computer system, causes the computer system to: modify a vehicle design to include a third-party feature, where modifying the vehicle design generates a modified vehicle design; execute a simulation based on the modified vehicle design; extract, from the simulation, a third-party temporal logic of the third-party feature; and determine, based on the third-party temporal logic, an indication of whether the third-party feature is compliant with the vehicle design. Other embodiments of this aspect include corresponding computer systems, apparatus, and computer programs recorded on one or more computer storage devices, each configured to perform the actions of the methods.

Implementations may include one or more of the following features. The system where the vehicle design includes a design for an autonomous vehicle. The system where the simulation includes a virtualized version of a vehicle consistent with the modified vehicle design. The system where the third-party feature includes a component of a vehicle whose design is described by the vehicle design. The system where the component includes an ADAS system. The system where the component includes a vehicle safety system. The system where the component includes an autonomous driving system. The system the computer code, when executed by the computer system, causes the computer system to determine, based on the third-party temporal logic, the indication of whether the third-party feature is compliant with the vehicle design at least by: determining whether the third-party temporal logic is compatible with an OEM temporal logic of an OEM feature included in the vehicle design; and responsive to determining that the third-party temporal logic is compatible with the OEM temporal logic, generating the indication indicating that the third-party feature is compliant with the OEM feature. Implementations of the described techniques may include hardware, a method or process, or computer software on a computer-accessible medium.

BRIEF DESCRIPTION OF THE DRAWINGS

The disclosure is illustrated by way of example, and not by way of limitation in the figures of the accompanying drawings in which like reference numerals are used to refer to similar elements.

FIG. 7A depicts an example table including types of data for different features according to some embodiments.

FIG. 7B depicts an example table including example tools for formal language definition, simulation, and verification according to some embodiments.

DETAILED DESCRIPTION

Figure 1A:
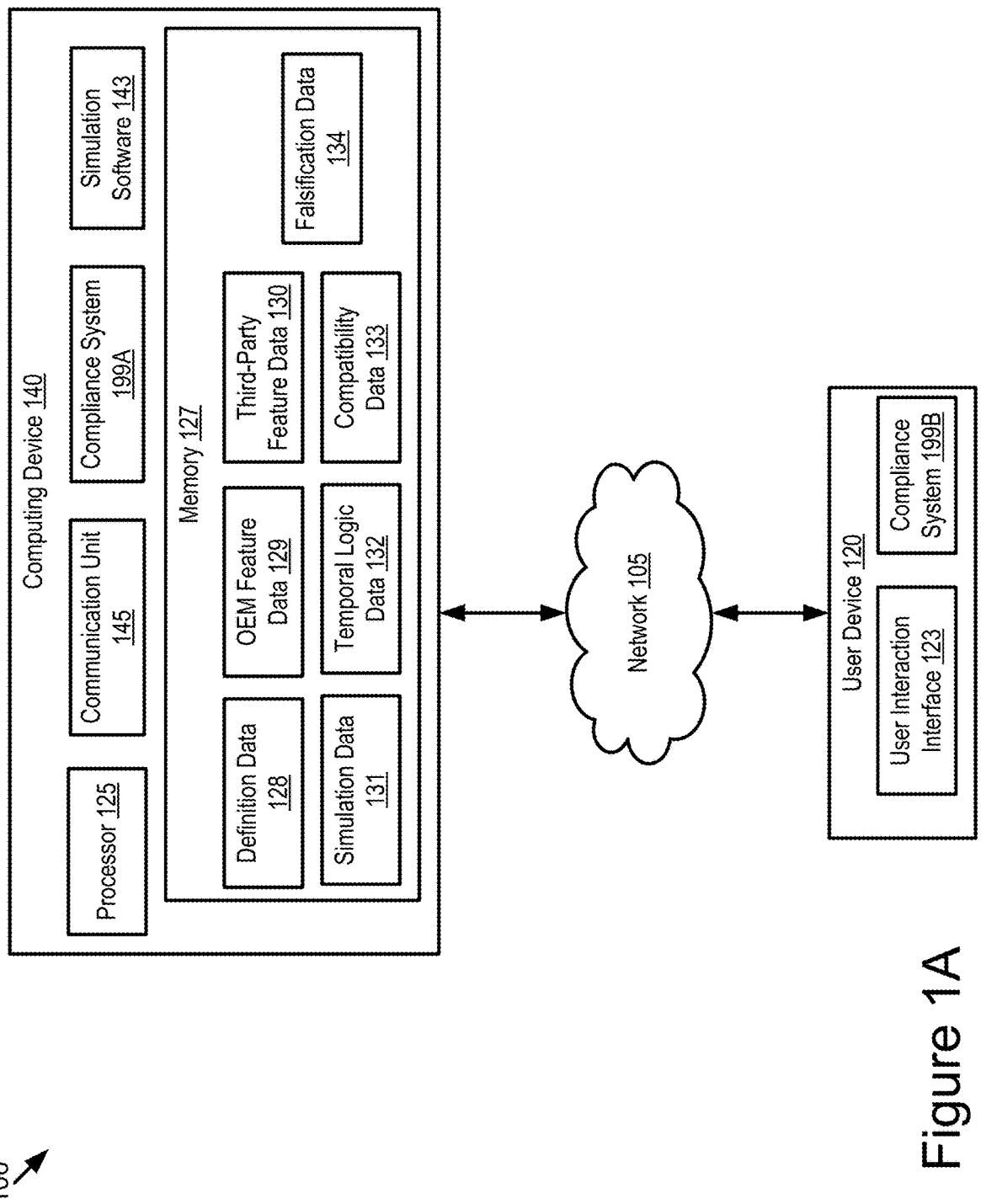
FIG. 1A is a block diagram illustrating an operating environment for a compliance system according to some embodiments.

A third-party feature may need to be tested to check its compatibility with a vehicle design before integrating it into a vehicle. Test engineers or integration engineers may generate test specifications (or requirements) that are used to test the third-party feature. Automated test cases and scenarios that are currently used need to rely on these test specifications. However, in some scenarios these manually generated test specifications may not exhaustively cover all the testing parameters or aspects and there may be test specifications that are unknown or overseen by the engineers. Besides, these testing and integrating procedures consume a lot of time and a lot of resources. It becomes even more difficult when models of the structure and operations of the third-party feature are not known beforehand.

For example, various testing approaches are currently used in an industrial setting, including, e.g., a black-box testing, a sanity testing, a fuzzing testing, a white-box testing, and a gray-box testing, etc. In the black-box testing, internal operations and structure of the features may not be known. Only inputs and outputs of the black-box testing are known. The black-box testing uses the test specifications as the basis for test cases. The sanity testing is used check correctness of a tested system. An example drawback includes that the sanity test sometimes cannot find the errors and is more inclined towards checking satisfaction or validity of the system operations. The fuzzing testing includes an automated software testing procedure that provides invalid, incorrect, random, or unexpected data as inputs to a program and then monitors operations of the program to identify errors or failures. However, the fuzzing testing is only applicable to an internal structure of the program and not to the outputs. In the white-box testing, an internal structure and operations are known. In the gray-box testing, an internal structure and operations are partially known.

However, these testing approaches described above are time-consuming and require plenty of hardware resources and carefully chosen test scenarios. For example, these testing approaches rely on experience of test engineers to develop test cases for identification of errors and boundary conditions, etc. The test specifications used in the testing are also specified by the test engineers and hence may not cover all the possible executions of a tested system (e.g., only some possible inputs are tested, and some program paths may be left untested). Without clear test specifications, test cases may be difficult to design and may result in redundant testing or checking.

Described herein are embodiments of a compliance system that is operable to test a third-party feature for compatibility and integration with a vehicle design that includes an OEM feature. For example, the compliance system extracts behaviors of the OEM feature and the third-party feature and performs automated simulations and testing on the OEM feature and the third-party feature respectively. The compliance system may also perform a falsification (bug-finding) process that can potentially save a significant amount of time and resources while delivering desired test results.

Example improvements and advantages provided by the compliance system described herein are provided here. For example, for each of the third-party feature and the OEM feature, the compliance system makes use of a technique that simulates a system with the corresponding feature and outputs simulation data. Then, the compliance system automatically learns a temporal specification of the feature based on the simulation data. That is, unlike some existing technologies that require a template of a test specification is known beforehand, the compliance system can automatically estimate a template for the test specification (e.g., the temporal specification). The compliance system also estimates values for parameters in the temporal specification. In this case, the temporal specification does not need to be specified by test engineers. This can be useful when the temporal specification is unknown or overlooked by the test engineers.

In another example, unlike some existing technologies that require existence of both normal and anomalous time-series data labeled by human experts for specification extraction, the compliance system can efficiently learn and detect anomaly traces if there is any. Thus, the compliance system does not require human experts to perform the labor of annotating and labeling the data.

Moreover, the compliance system described herein is applicable to any temporal specification (e.g., unlike some existing technologies that is restricted to only signal temporal specifications). The compliance system uses statistical analysis to accurately extract model behaviors and reduce computational costs (resources and time) by many magnitudes compared to existing technologies. The learned temporal specification can directly be used to check the compatibility and integration of the third-party feature by the OEM. The compliance system described herein can be applied to any of the testing approaches mentioned above. It is particularly useful in the black-box testing and the gray-box testing where the internal operations are partially or fully unknown. The compliance system can extract this missing information in terms of temporal specifications using formal languages. Other example advantages of the compliance system are also possible.

The compliance system described herein can be applicable to various scenarios including manufacturing industries, automotive industries, and medical industries, etc. In each of the scenarios, there may be various products that include parts made by different suppliers. For example, in medical devices such as pacemakers, and insulin pumps, etc., the application of the compliance system can provide more insight about the characteristics of data that the device needs to process. An extracted temporal specification can be used to identify the data that can potentially cause the device to behave erratically. In another example, security systems can apply the compliance system to quickly determine and predict the characteristics of attacks, which may have been overlooked by designers so that designs of the security systems are improved. In yet another example, the compliance system can also be applicable in machine learning tasks such as classification, real-time traffic management or monitoring, anomaly detection and identification, etc.

Example Overview

Referring to FIG. 1A, depicted is an operating environment 100 for a compliance system 199A and 199B (herein "compliance system 199") according to some embodiments. The operating environment 100 may include one or more of the following elements: a user device 120; and a computing device 140. These elements of the operating environment 100 may be communicatively coupled to a network 105. In practice, the operating environment 100 may include any number of user devices 120, computing devices 140 and networks 105.

The network 105 may be a conventional type, wired or wireless, and may have numerous different configurations including a star configuration, token ring configuration, or other configurations. Furthermore, the network 105 may include a local area network (LAN), a wide area network (WAN) (e.g., the Internet), or other interconnected data paths across which multiple devices and/or entities may communicate. In some embodiments, the network 105 may include a peer-to-peer network. The network 105 may also be coupled to or may include portions of a telecommunications network for sending data in a variety of different communication protocols. In some embodiments, the network 105 includes Bluetooth® communication networks or a cellular communications network for sending and receiving data including via short messaging service (SMS) and multimedia messaging service (MMS). In some embodiments, the network 105 further includes networks for hypertext transfer protocol (HTTP), direct data connection, wireless application protocol (WAP), e-mail, Dedicated Short Range Communication (DSRC), full-duplex wireless communication and mmWave. In some embodiments, the network 105 further includes networks for WiFi (infrastructure mode), WiFi (ad-hoc mode), visible light communication, TV white space communication and satellite communication. The network 105 may also include a mobile data network that may include 3G, 4G, Long Term Evolution (LTE), LTE-Vehicle-to-Everything (LTE-V2X), LTE-Device-to-Device (LTE-D2D), Voice over LTE (VoLTE), 5G-V2X or any other mobile data network. The network 105 may also include any combination of mobile data networks. Further, the network 105 may include one or more IEEE 802.11 wireless networks.

The computing device 140 may be any computing device including, e.g., a centralized computing device or a server, etc. In some embodiments, the computing device 140 may include one or more of the following elements: a processor 125; a memory 127; a communication unit 145; a simulation software 143; and a compliance system 199A. These elements of the computing device 140 may be communicatively coupled to one another via a bus.

In some embodiments, the processor 125 and the memory 127 may be elements of a computer system (such as computer system 200 described below with reference to FIG. 2). The computer system may be operable to cause or control the operation of the compliance system 199A. For example, the computer system may be operable to access and execute the data stored on the memory 127 to provide the functionality described herein for the compliance system 199A or its elements (see, e.g., FIG. 2).

The processor 125 includes an arithmetic logic unit, a microprocessor, a general-purpose controller, or some other processor array to perform computations and provide electronic display signals to a display device. The processor 125 processes data signals and may include various computing architectures. Example computing architectures include a complex instruction set computer (CISC) architecture, a reduced instruction set computer (RISC) architecture, or an architecture implementing a combination of instruction sets. The computing device 140 may include one or more processors 125. Other processors, operating systems, sensors, displays, and physical configurations may be possible.

The memory 127 stores instructions or data that may be executed by the processor 125. The instructions or data may include code for performing the techniques described herein. The memory 127 may be a dynamic random-access memory (DRAM) device, a static random-access memory (SRAM) device, flash memory, or some other memory device. In some embodiments, the memory 127 also includes a non-volatile memory or similar permanent storage device and media. Example permanent storage devices include a hard disk drive, a floppy disk drive, a CD-ROM device, a DVD-ROM device, a DVD-RAM device, a DVD-RW device, and a flash memory device, etc. Additional example permanent storage devices may include some other mass storage device for storing information on a more permanent basis. The computing device 140 may include one or more memories 127.

The memory 127 may store one or more of the following elements: definition data 128; OEM feature data 129; third-party feature data 130; simulation data 131; temporal logic data 132; compatibility data 133; and falsification data 134.

The definition data 128 may include digital data describing semantics of a temporal specification and natural language so that the temporal specification can be translated into natural language to facilitate understanding of the temporal specification.

The OEM feature data 129 may include digital data describing an OEM feature of a vehicle design. For example, the OEM feature may include an adaptive cruise control functionality designed by an OEM of a vehicle. Other example OEM features may include, but are not limited to, the following: an ADAS system; a vehicle safety system; and an autonomous driving system, etc. The vehicle design may specify the functionality of these OEM features. In some embodiments, the vehicle design may be referred to as an OEM vehicle design. The vehicle design may include a design specification of a vehicle. For example, the vehicle design includes a design for an autonomous vehicle.

The third-party feature data 130 may include digital data describing a third-party feature provided by a third-party entity. In some embodiments, the third-party feature includes a component of a vehicle whose design is described by the vehicle design. For example, the third-party feature may include an adaptive cruise control system that can provide an adaptive cruise control functionality described by the OEM vehicle design. In another example, the third-party feature includes an ADAS system whose design is described by the OEM vehicle design, where an implementation (including software, hardware, etc.) of the ADAS system is provided by a third-party entity.

Other example third-party features may include a vehicle safety system and an autonomous driving system, etc., whose functionality is described by the OEM vehicle design, where implementations of these systems are provided by one or more third-party entities. As described below in more detail, the compliance system described herein can test these third-party features for compatibility with the OEM vehicle design and can integrate these third-party features into the OEM vehicle design if these third-party features are compatible.

The simulation data 131 may include digital data describing a simulation result of an OEM feature, a third-party feature, or a combination thereof.

The temporal logic data 132 may include digital data describing an OEM temporal logic, a third-party temporal logic, or a combination thereof. The OEM temporal logic and the third-party temporal logic are described below in more detail.

The compatibility data 133 may include digital data describing a degree of compatibility of a third-party feature with respect to an OEM vehicle design. For example, the compatibility data 133 includes digital data describing a compatibility score between an OEM feature and a third-party feature.

The falsification data 134 may include digital data describing a falsification result (e.g., a bug-finding result) of the OEM feature, the third-party feature, or a combination thereof.

The simulation software 143 may be used to simulate an OEM feature, a third-party feature, or a combination thereof and generate a corresponding simulation result. For example, when simulating the OEM feature, the simulation software 143 includes a first virtualized version of a vehicle that includes the OEM feature. When simulating the third-party feature, the simulation software 143 includes a second virtualized version of the vehicle that includes the third-party feature.

In some embodiments, the simulation software 143 can be part of the compliance system 199A. In some other embodiments, the compliance system 199A can be a component or a plugin of the simulation software 143.

The communication unit 145 transmits and receives data to and from the network 105 or to another communication channel. In some embodiments, the communication unit 145 includes a port for direct physical connection to the network 105 or to another communication channel. For example, the communication unit 145 includes a USB, SD, CAT-5, or similar port for wired communication with the network 105. In some embodiments, the communication unit 145 includes a wireless transceiver for exchanging data with the network 105 or other communication channels using one or more wireless communication methods. Example wireless communication methods may include one or more of the following: IEEE 802.11; and IEEE 802.16, BLUETOOTH®.

In some embodiments, the communication unit 145 includes a cellular communications transceiver for sending and receiving data over a cellular communications network. For example, the data may be sent or received via short messaging service (SMS), multimedia messaging service (MMS), hypertext transfer protocol (HTTP), direct data connection, WAP, e-mail, or another suitable type of electronic communication. In some embodiments, the communication unit 145 includes a wired port and a wireless transceiver. The communication unit 145 also provides other conventional connections to the network 105 for distribution of files or media objects using standard network protocols including TCP/IP, HTTP, HTTPS, and SMTP, millimeter wave, Dedicated Short Range communication (DSRC), etc.

The user device 120 can be a computing device that is accessible by a user. For example, the user device 120 can be a desktop computer, a laptop computer, a tablet computer, a smart phone, a wearable electronic device, or any other electronic device that can be accessed by a test engineer. The user device 120 may include a processor and a memory that are similar to the processor 125 and the memory 127 respectively.

In some embodiments, the user device 120 includes a user interaction interface 123 so that a test engineer can operate on the user device 120 via the user interaction interface 123. The user interaction interface 123 may include one or more of a keyboard, a mouse, a display (e.g., a touch screen), a voice control device (e.g., a microphone) and a speaker system, etc. In some embodiments, the user device 120 may also include an instance of the compliance system (e.g., a compliance system 199B).

The compliance systems 199A and 199B may have similar structure and provide similar functionality and may be referred to herein as a "compliance system 199," individually or collectively.

In some embodiments, the compliance system 199 includes software that is operable to test compatibility of a third-party feature with respect to a vehicle design. In some embodiments, the compliance system 199 may be implemented using hardware including a field-programmable gate array ("FPGA") or an application-specific integrated circuit ("ASIC"). In some other embodiments, the compliance system 199 may be implemented using a combination of hardware and software. The compliance system 199 may be stored in a combination of the devices (e.g., servers or other devices), or in one of the devices.

In some embodiments, the compliance system 199 is specifically designed to assist automotive engineers whose work includes ensuring that third-party features are compliant with design specifications of vehicles which are designed by an OEM.

In some embodiments, the compliance system 199 may be a stand-alone simulation software program or a plugin for the simulation software 143. The compliance system 199 includes code and routines that execute simulations which (1) extract a temporal logic for an OEM feature and (2) extract a temporal logic for a third-party feature which may replace the OEM feature in a vehicle. The compliance system 199 also includes code and routines that compares the temporal logic of the OEM feature with the temporal logic of the third-party feature to determine if the third-party feature is sufficiently compliant with a design specification for the vehicle. In some embodiments, the compliance system 199 outputs a compatibility score, or some other indication, which describes how compliant the third-party feature is with the design specification for the vehicle.

The compliance system 199 is described below in more detail with reference to FIGS. 1B-6 and 8A-8D.

Figure 1B:
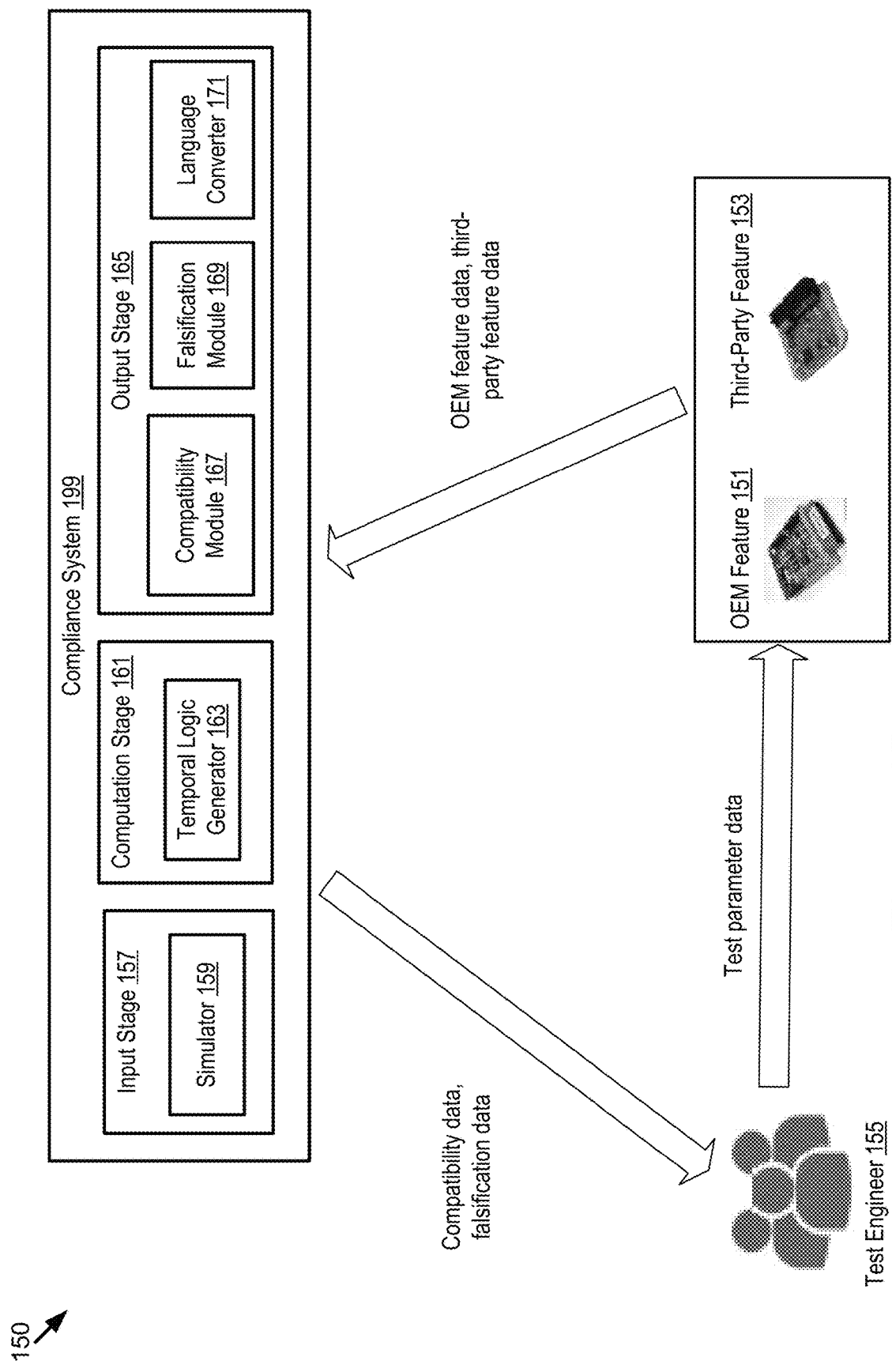
FIG. 1B is a block diagram illustrating a framework for the compliance system according to some embodiments.

Referring to FIG. 1B, a framework 150 for the compliance system 199 is illustrated according to some embodiments. Assume that a vehicle design includes an OEM feature 151. A third-party feature 153 is tested for compatibility with the vehicle design. The compliance system 199 tests the compatibility between the third-party feature 153 and the OEM feature 151. Responsive to the third-party feature 153 being compatible with the OEM feature 151, the compliance system 199 may determine that the third-party feature 153 is compatible with the vehicle design and can be potentially integrated into a vehicle manufactured by the OEM.

Initially, a test engineer 155 may input various test parameter data for testing compatibility of the third-party feature 153 using the user interaction interface 123.

For example, the test engineer 155 may identify the third-party feature that can be potentially integrated into the vehicle. The test engineer 155 may specify one or more types of data and a range of possible values to be tested for the feature. Example types of data included in different features (e.g., an OEM feature or a third-party feature) are shown in Table 1 illustrated in FIG. 7A. For example, for a "controller" feature such as an "electronic control unit (ECU)," a type of data to be tested for the feature includes output data of the ECU. In another example, for a "sensor" feature that provides a distance measurement functionality, types of data to be tested for the feature may include output data from sensors such as LIDAR, radar, or any other distance-measuring sensor.

In another example, the test engineer 155 also defines semantics of a test specification in terms of temporal logics (e.g., a temporal specification) and in terms of natural language. Then, based on the defined semantics, the temporal specification can be translated to natural language to facilitate the test engineer's understanding.

In yet another example, the test engineer 155 may also specify other possible test parameter data, e.g., a total number of simulation times for each feature, a time interval for each simulation, etc.

The compliance system 199 may receive the above test parameter data identified or specified by the test engineer 155. For example, the compliance system 199 may receive one or more of the types of data, the semantics of temporal logics and natural language, OEM feature data describing the OEM feature 151, and third-party feature data describing the third-party feature 153, etc.

The compliance system 199 may simulate a first vehicle system that includes the OEM feature 151 using the simulation software 143 and the test parameter data. The compliance system 199 may extract a first temporal specification (e.g., one or more OEM temporal logics) for the OEM feature 151. The compliance system 199 may also simulate a second vehicle system that includes the third-party feature 153 using the simulation software 143 and the test parameter data. The compliance system 199 may extract a second temporal specification (e.g., one or more third-party temporal logics) for the third-party feature 153. The compliance system 199 generates a compatibility score for the first and second temporal specifications (e.g., a compatibility score between the one or more OEM temporal logics and the one or more third-party temporal logics). The compliance system 199 can also perform a falsification process to identify one or more inputs that result in undesired outputs of the first (or second) vehicle system with respect to the given first (or second) temporal specification.

In some embodiments, operations of the compliance system 199 can be divided into three stages: an input stage 157; a computation stage 161; and an output stage 165. The compliance system 199 may include: a simulator 159 at the input stage 157; a temporal logic generator 163 at the computation stage 161; and a compatibility module 167, a falsification module 169 and a language converter 171 at the output stage 165.

At the input stage 157, the simulator 159 uses the test parameter data and performs a simulation for each of the OEM feature and the third-party feature respectively to generate corresponding simulation data. The corresponding simulation data is passed onto the temporal logic generator 163.

At the computation stage 161, the temporal logic generator 163 uses definitions of the temporal logics and generates a temporal specification for each of the OEM feature and the third-party feature based on the corresponding simulation data respectively. For example, the temporal logic generator 163 extracts a first temporal specification for the OEM feature and a second temporal specification for the third-party feature. The extracted first and second temporal specifications are passed to the output stage 165 for interpretation.

At the output stage 165, the compatibility module 167 checks a first robustness measurement of the first temporal specification and a second robustness measurement for the second temporal specification. The first and second robustness measurements indicate a compatibility score (i.e., a degree of compatibility) of the third-party party feature with respect to the OEM feature. A calculation of a robustness measurement is described below in more detail. The compatibility module 167 may generate compatibility data describing a compatibility score.

At the output stage 165, the falsification module 169 may perform a falsification process with respect to the first and second temporal specifications, respectively. The falsification module 169 may generate falsification data describing a result from the falsification process. The language converter 171 may use the definitions of the temporal logics and natural language to interpret the extracted first and second temporal specifications and convert the extracted first and second temporal specifications to natural language.

The compatibility data, the falsification data and the first and second temporal specifications may be transmitted to the user device 120 operated by the test engineer 155. The test engineer 155 can evaluate the third-party feature based on one or more of the compatibility data, the falsification data and the first and second temporal specifications. The test engineer 155 may also use the compatibility data, the falsification data and the first and second temporal specifications for additional testing and decision-making.

The simulator 159, the temporal logic generator 163, the compatibility module 167, the falsification module 169 and the language converter 171 of the compliance system 199 are described below in more detail with reference to FIGS. 2-6 and 8A-8D.

A specific example that illustrates operations of the compliance system 199 is provided here. In this example, a vehicle to be released by an OEM includes an OEM feature that provides a cruise control functionality in the vehicle. A third-party entity develops a cruise control system for inclusion in the vehicle such that the cruise control system can provide the cruise control functionality designed by the OEM.

The OEM generates design data for the vehicle. The design data includes digital data that describes a design specification for the vehicle. The design specification includes OEM feature data for the cruise control functionality. The OEM feature data includes digital data that describes design requirements for the cruise control functionality. The third-party entity delivers third-party data to the OEM. The third-party data includes digital data that describes a design of the cruise control system as generated by the third-party entity. Assume that the compliance system 199 is a plugin for the simulation software 143. The following operations (1)-(8) are performed in this example:

Operation (1): The test engineer 155 for the OEM inputs test parameter data into the compliance system 199. The test parameter data includes one or more of the following: (1) the design data, which includes the OEM feature data; (2) the third-party data; (3) test data describing the simulations to be executed by the simulation software 143; and (4) a temporal logic language.

Operation (2): The compliance system 199 causes the simulation software 143 to execute a first set of simulations which simulate the operation of the vehicle in a set of simulation environments. At this operation, the design data is not modified.

Operation (3): The compliance system 199 observes the first set of simulations at operation (2) and extracts, based on these simulations, OEM temporal logic data for the OEM feature. The OEM temporal logic data includes digital data that describes a temporal logic of the OEM feature.

Operation (4): The compliance system 199 causes the simulation software 143 to execute a second set of simulations which simulate the operation of the vehicle in a set of simulation environments. The set of simulation environments is the same as those at operation (3). At this operation, the design data is modified based on the third-party data so that the design for the vehicle as simulated includes the cruise control system as designed by the third-party entity.

Operation (5): The compliance system 199 observes the second set of simulations at operation (4) and extracts, based on these simulations, third-party temporal logic data for the cruise control system. The third-party temporal logic data includes digital data that describes a temporal logic of the cruise control system as designed by the third-party entity and installed in the vehicle when operated.

Operation (6): The compliance system 199 compares the temporal logic of the OEM feature to the temporal logic of the cruise control system as designed by the third-party entity.

Operation (7): The compliance system 199 outputs, based on the comparison at operation (6), a compatibility score which indicates how compatible the cruise control system is with the design specification of the vehicle.

Operation (8): The test engineer 155 decides about whether to include the cruise control system in the vehicle when it is made commercially available based on the compatibility score.

To facilitate discussion of the compliance system 199 below, semantics of temporal logics and natural language is described here. The semantics of temporal logics and natural language can be specified by the test engineer 155 or any other suitable entity. A temporal specification can be used to reason about time-series data. A temporal specification includes one or more temporal logics. Each temporal logic includes one or more atomic logics combined with one or more temporal-logic operators. An atomic logic includes a Boolean-valued expression which determines the truth or falsity of the expression. Examples of an atomic logic include: (a>b); and (4<=9), etc. A temporal-logic operator quantifies the atomic logic in a given time interval. For example, semantics for some example temporal-logic operators includes:

F_[t1, t2] (S1), which means that an atomic logic S1 is true for at least one-time step anywhere in a time interval [t1, t2];

G_[t1, t2] (S1), which means that an atomic logic S1 holds true at all time steps in the time interval [t1, t2]; and (S1) U_[t1, t2] (S2), which is a binary operator on two atomic logics S1 and S2 and means that a precedent logic S1 holds true for all time steps until at some time steps in the interval [t1, t2] at which an antecedent logic S2 becomes true.

An example for a temporal logic is: G_[0, 5] (A=>B), where A and B are atomic logics and G_[0, 5] indicates that an implication statement (e.g., A=>B) holds to be true at all time steps in a time interval [0, 5].

A temporal logic can be characterized by a robustness measurement that indicates a degree to which a set of time-series data satisfies the temporal logic. A higher robustness measurement indicates a higher degree to which the set of time-series data satisfies the temporal logic. For example, assume that an atomic logic of a temporal logic at a time interval [t0, t1] is (x[t]>=5) at time t and a value of the data x at time t is x[t]=$x_t$. Then, a robustness value at time t is r(t)=$x_t$−5. A robustness measurement for the temporal logic is an average of the robustness values at the entire time interval [t0, t1], which is $$\frac{1}{t_1 - t_0} \sum_{t=t_0}^{t_1} r(t) = \frac{1}{t_1 - t_0} \sum_{t=t_0}^{t_1} (x_t - 5).$$

To illustrate a subset of a temporal logic, consider two temporal logics F1: G_[0, 10](x[t]>=5) and F2: G_[2, 6](x[t]>=5). It can be seen that whenever F1 is satisfied, F2 is also satisfied, but not vice versa. For example, there can exist a time t=7 at which x[t]<5, which causes F1 to be unsatisfied while F2 is still satisfied. Hence, it can be considered that F1 is a subset of F2.

Example types of temporal specifications include the following: signal temporal logic (STL), computational tree logic (CTL), metric temporal logic (MTL), parametric signal temporal logic (PSTL), timed propositional temporal logic (TPTL), and timed-quality temporal logic (TQTL), etc. These temporal logics generally follow the semantics mentioned above and can also be modified as desired by the test engineers to define custom semantics. In existing technologies, all these temporal specifications are manually specified or designed for testing and in many cases, do not cover all the test scenarios. However, the compliance system 199 described herein can automatically extract these temporal specifications from the simulation data as described below in more detail. Some example tools which support these temporal specifications are shown in Table 2 of FIG. 7B.

Example Computer System

Figure 2:
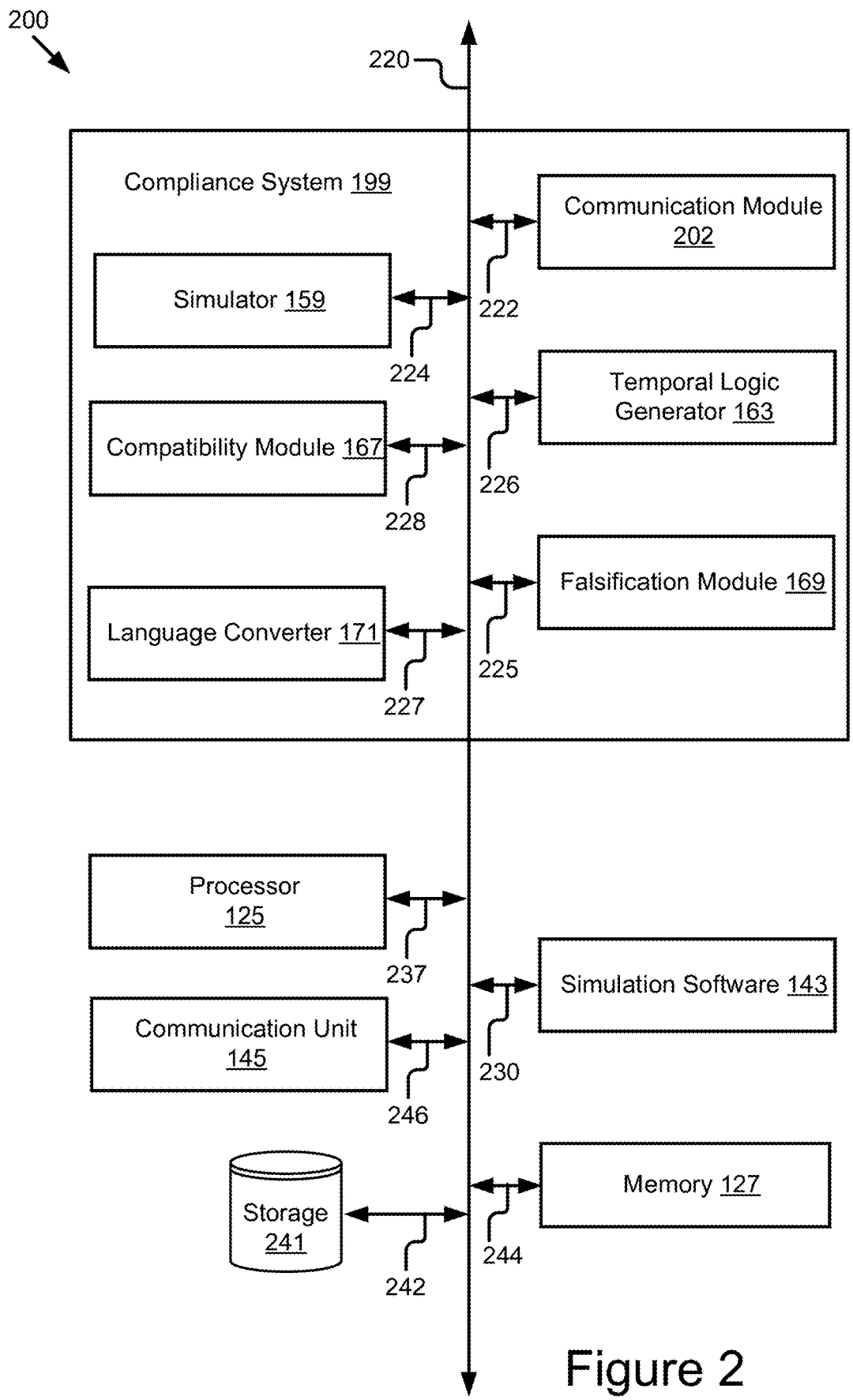
FIG. 2 is a block diagram illustrating an example computer system including the compliance system according to some embodiments.

Referring now to FIG. 2, depicted is a block diagram illustrating an example computer system 200 including the compliance system 199 according to some embodiments. In some embodiments, the computer system 200 may include a special-purpose computer system that is programmed to perform one or more steps of methods 300 and 400, an operational sequence 500 and a flowchart 600 described below with references to FIGS. 3-6.

In some embodiments, the computer system 200 may be an element of the computing device 140. In some embodiments, the computer system 200 may be an element of the user device 120.

The computer system 200 may include one or more of the following elements according to some examples: the compliance system 199; the processor 125; the communication unit 145; the memory 127; the simulation software 143; and a storage 241. The components of the computer system 200 are communicatively coupled by a bus 220.

In the illustrated embodiment, the processor 125 is communicatively coupled to the bus 220 via a signal line 237. The communication unit 145 is communicatively coupled to the bus 220 via a signal line 246. The storage 241 is communicatively coupled to the bus 220 via a signal line 242. The simulation software 143 is communicatively coupled to the bus 220 via a signal line 230. The memory 127 is communicatively coupled to the bus 220 via a signal line 244.

The following elements are described above with reference to FIG. 1A: the processor 125; the communication unit 145; the simulation software 143; and the memory 127. Those descriptions will not be repeated here.

The storage 241 can be a non-transitory storage medium that stores data for providing the functionality described herein. The storage 241 may be a DRAM device, a SRAM device, flash memory, or some other memory devices. In some embodiments, the storage 241 also includes a non-volatile memory or similar permanent storage device and media (e.g., a hard disk drive, a floppy disk drive, a flash memory device, etc.) for storing information on a more permanent basis.

In the illustrated embodiment shown in FIG. 2, the compliance system 199 includes: a communication module 202; the simulator 159; the temporal logic generator 163; the compatibility module 167; the falsification module 169; and the language converter 171. These components of the compliance system 199 are communicatively coupled to each other via the bus 220. In some embodiments, components of the compliance system 199 can be stored in a single server or device. In some other embodiments, components of the compliance system 199 can be distributed and stored across multiple servers or devices.

The communication module 202 can be software including routines for handling communications between the compliance system 199 and other components of the computer system 200. In some embodiments, the communication module 202 can be stored in the memory 127 of the computer system 200 and can be accessible and executable by the processor 125. The communication module 202 may be adapted for cooperation and communication with the processor 125 and other components of the computer system 200 via a signal line 222.

The communication module 202 sends and receives data, via the communication unit 145, to and from one or more elements of the operating environment 100. For example, the communication module 202 transmits, via the communication unit 145, compatibility data to the user device 120. The communication module 202 may send or receive any of the data or messages described above with reference to FIGS. 1A-1B via the communication unit 145.

In some embodiments, the communication module 202 receives data from the other components of the compliance system 199 and stores the data in one or more of the storage 241 and the memory 127. The other components of the compliance system 199 may cause the communication module 202 to communicate with the other elements of the computer system 200 or the operating environment 100 (via the communication unit 145). For example, the simulator 159 may use the communication module 202 to communicate with the simulation software 143 and cause the simulation software 143 to run a set of simulations.

The simulator 159 can be software including routines for running a simulation for a feature using the simulation software 143. In some embodiments, the simulator 159 can be stored in the memory 127 of the computer system 200 and can be accessible and executable by the processor 125. The simulator 159 may be adapted for cooperation and communication with the processor 125 and other components of the computer system 200 via a signal line 224.

In some embodiments, the test engineer 155 inputs test parameter data via the user interaction interface 123, and the simulator 159 is operable to receive the test parameter data. The test parameter data includes feature data describing a feature (e.g., an OEM feature, a third-party feature), one or more types of data for the feature, one or more ranges of the types of data to be tested. The OEM can design or create its own test data or benchmark data or can use public data that is standardized across various organizations or entities for the test (e.g., Table 1 in FIG. 7A shows some example standardized types of data for different features). The test parameter data may also include temporal logic language definitions specified by the test engineer 155 so that the extracted temporal specification can be easily converted to natural language for better understanding. The test parameter data may also include other test data needed to run simulations.

The simulator 159 uses the test parameter data and the simulation software 143 to execute a simulation for the feature for a specified time period and outputs simulation data for the feature. The simulation includes a virtualized version of a vehicle with the feature being incorporated into the vehicle. In some examples, the simulator 159 may use cyber-physical system simulation and verification tools to run the simulation for any desired period of time. Some example tools are shown in Table 2 in FIG. 7B.

For example, the simulator 159 causes the simulation software 143 to run a set of simulations which simulate an operation of the vehicle with the feature in a set of simulation environments. As a result of running the set of simulations, the simulator 159 obtains intermediate output data from the simulation software 143 and generates the simulation data from the intermediate output data. For example, the simulator 159 computes various statistics data such as a mean, variances, etc., on the intermediate output data. The simulator 159 may also conduct a curve approximation (or curve-fitting) process to extract an optimal (or minimum) number of curves (e.g., lines, splines, quadratic, cubic, etc.) that accurately represent the intermediate output data. These curves represent atomic predicates for a temporal specification of the feature. The generated simulation data may include the various statistics data and the various curves obtained from the curve approximation (or curve-fitting) process (e.g., including the atomic predicates).

Example simulation data is shown in Table 1 of FIG. 7A. For example, referring to FIG. 7A, for a "sensor" feature that provides functionality of a distance measurement, example types of data to be used in the simulation includes LIDAR data, and radar data, etc. Example simulation data for this "sensor" feature includes a range of real numbers. Example simulation data with curve approximation is shown in FIGS. 8A-8D, which are described below in more detail.

In some examples, with respect to the feature being an OEM feature, the simulator 159 executes a first simulation based on a vehicle design that includes the OEM feature. For example, the simulator 159 causes the simulation software 143 to run a first set of simulations which simulate an operation of the vehicle with the OEM feature in a set of simulation environments. Then, the simulator 159 generates first simulation data for the OEM feature.

In some examples, with respect to the feature being a third-party feature, the simulator 159 modifies the vehicle design to include the third-party feature so that a modified vehicle design is generated. The simulator 159 executes a second simulation based on the modified vehicle design that includes the third-party feature. For example, the simulator 159 causes the simulation software 143 to run a second set of simulations which simulate an operation of the vehicle with the third-party feature in the set of simulation environments. Then, the simulator 159 generates second simulation data for the third-party feature.

The temporal logic generator 163 can be software including routines for extracting a temporal specification for a feature. In some embodiments, the temporal logic generator 163 can be stored in the memory 127 of the computer system 200 and can be accessible and executable by the processor 125. The temporal logic generator 163 may be adapted for cooperation and communication with the processor 125 and other components of the computer system 200 via a signal line 226.

In some embodiments, the temporal logic generator 163 receives simulation data associated with a feature from the simulator 159. Based on the defined semantics of temporal logics and natural language and the simulation data, the temporal logic generator 163 executes a search mechanism to generate a set of candidate temporal logics. For example, the set of candidate temporal logics are generated using one or more atomic predicates included in the simulation data. The search mechanism can employ different search strategies (e.g., exhaustive, selective, guided, heuristic-based etc.) for a higher efficiency. The temporal logic generator 163 computes a robustness measurement of each candidate temporal logic so that a set of robustness measurements are generated for the set of candidate temporal logics. The temporal logic generator 163 extracts a temporal logic for the feature from the set of candidate temporal logics. For example, the extracted temporal logic is a candidate temporal logic that satisfies the simulation data (e.g., that satisfies the atomic predicates in the simulation data) and has a maximum robustness measurement among the set of candidate temporal logics. An example process to extract temporal logics is described below with reference to FIGS. 8A-8D.

In some examples, with respect to the feature being an OEM feature, the temporal logic generator 163 extracts, from the first simulation data, an OEM temporal logic of the OEM feature.

In some examples, with respect to the feature being a third-party feature, the temporal logic generator 163 extracts, from the second simulation data, a third-party temporal logic of the third-party feature.

The compatibility module 167 can be software including routines for determining whether a third-party feature is compatible with a vehicle design. In some embodiments, the compatibility module 167 can be stored in the memory 127 of the computer system 200 and can be accessible and executable by the processor 125. The compatibility module 167 may be adapted for cooperation and communication with the processor 125 and other components of the computer system 200 via a signal line 228.

In some embodiments, the compatibility module 167 receives temporal logic data describing an OEM temporal logic of an OEM feature and a third-party temporal logic of a third-party feature from the temporal logic generator 163.

The compatibility module 167 determines, based on the third-party temporal logic, an indication of whether the third-party feature is compliant with the vehicle design.

Specifically, the compatibility module 167 determines whether the third-party temporal logic is compatible with the OEM temporal logic of the OEM feature included in the vehicle design. Responsive to determining that the third-party temporal logic is compatible with the OEM temporal logic, the compatibility module 167 generates an indication indicating that the third-party feature is compliant with the OEM feature. Otherwise, the compatibility module 167 may generate an indication indicating that the third-party feature is not compliant with the OEM feature. The indication may be, for example, a compatibility score as described below. In some embodiments, the compatibility score may describe a degree of similarity between the OEM temporal logic (or the OEM feature) and the third-party temporal logic (or the third-party feature).

For example, the compatibility module 167 compares the OEM temporal logic with the third-party temporal logic to obtain a comparison result and generates a compatibility score based on the comparison result. The comparison result may include the following three cases:

Case 1: The OEM temporal logic and the third-party temporal logic are different, and so, the OEM feature and the third-party feature can be regarded as incompatible. The compatibility module 167 generates a compatibility score as "incompatible." For example, assume that the OEM temporal logic is $G\_[0, 10](x[t]>=5)$, and the third-party temporal logic is $F\_[2, 9](x[t]>=5)$. Because the OEM temporal logic is different from the third-party temporal logic, the compatibility score has a value of 0%, which indicates there is 0% compatibility between the OEM feature and the third-party feature.

Case 2: The OEM temporal logic and the third-party temporal logic are identical, and so, the OEM feature and the third-party feature can be regarded as compatible. The compatibility module 167 generates a compatibility score as "compatible." For example, assume that the OEM temporal logic is $G\_[0, 10](x[t]>=5)$, and the third-party temporal logic is also $G\_[0, 10](x[t]>=5)$. Because the OEM temporal logic is identical to the third-party temporal logic, the compatibility score has a value of 100%, which indicates there is 100% compatibility between the OEM feature and the third-party feature.

Case 3: One of the OEM temporal logic and the third-party temporal logic is a subset of the other one of the two temporal logics. The OEM feature and the third-party feature can be regarded as compatible or incompatible depending on a degree of similarity between the OEM temporal logic and the third-party temporal logic. The compatibility module 167 generates a first robustness measurement of the OEM feature and a second robustness measurement of the third-party feature. The compatibility module 167 generates a compatibility score based on the first robustness measurement and the second robustness measurement. For example, the compatibility score may include the first robustness measurement and the second robustness measurement, or a ratio between the first robustness measurement and the second robustness measurement. The compatibility score indicates which one of the OEM temporal logic and the third-party temporal logic is a subset of the other one of the two temporal logics.

With respect to the above Case 3, two examples are provided here. In a first example, assume that the OEM temporal logic is $G\_[0, 10](x[t]>=5)$ and the third-party temporal logic is $G\_[2, 9](x[t]>=5)$. Because the OEM temporal logic is substantially similar to the third-party temporal logic, the compatibility module 167 can generate a compatibility score as 8/11=72.7%, which indicates that the two temporal logics are 72.7% compatible. In this example, the numbers "8" and "11" represent the total numbers of time steps in the third-party temporal logic and the OEM temporal logic, respectively. Since the compatibility score is more than 50%, the compatibility module 167 may determine that the third-party feature is compatible with the OEM feature.

In a second example, assume that the OEM temporal logic is $G\_[0, 10](x[t]>=5)$ and the third-party temporal logic is $G\_[2, 3](x[t]>=5)$. Because the OEM temporal logic is not substantially similar to the third-party temporal logic, the compatibility module 167 can generate a compatibility score as 2/11=18.2%, which indicates that the two temporal logics are 18.2% compatible. In this example, the numbers "2" and "11" represent the total numbers of time steps in the third-party temporal logic and the OEM temporal logic, respectively. Since the compatibility score is less than 50%, the compatibility module 167 may determine that the third-party feature is not compatible with the OEM feature.

The falsification module 169 can be software including routines for performing a falsification process with respect to a particular feature. In some embodiments, the falsification module 169 can be stored in the memory 127 of the computer system 200 and can be accessible and executable by the processor 125. The falsification module 169 may be adapted for cooperation and communication with the processor 125 and other components of the computer system 200 via a signal line 225.

In some embodiments, the falsification module 169 initially chooses test parameter data for a feature that is inputted to the simulation. This particular test parameter data may result in a temporal logic having a lowest robustness value. Then, the falsification module 169 searches a space of the inputted test parameter data to find lower robustness value data until the falsification module 169 can identify a range of the test parameter data that causes a negative robustness value. This negative robustness value indicates a violation in an operation of the feature and facilitates debugging, testing, and designing of the feature. In the above operations of the falsification module 169, in some embodiments the robustness value can be replaced by the robustness measurement of the feature.

The language converter 171 can be software including routines for converting a temporal logic to natural language. In some embodiments, the language converter 171 can be stored in the memory 127 of the computer system 200 and can be accessible and executable by the processor 125. The language converter 171 may be adapted for cooperation and communication with the processor 125 and other components of the computer system 200 via a signal line 227.

In some embodiments, the language converter 171 receives temporal logic data describing an OEM temporal logic and a third-party temporal logic. The language converter 171 converts these two temporal logics to natural language using definitions of the temporal logics and natural language. The language converter 171 may send a conversion result of the two temporal logics to the user device 120 for presentation to the test engineer 155.

From the above description for FIG. 2, the compliance system 199 uses simulations to extract an OEM temporal logic of an OEM feature included in a vehicle design. The compliance system 199 also uses simulations to extract a third-party temporal logic of a third-party feature included in a modified vehicle design. The compliance system 199 determines whether the third-party temporal logic of the third-party feature is compliant with the OEM temporal logic for the OEM feature included in the vehicle design. Thus, the compliance system 199 can discover and extract any temporal specification that may be overseen by the test engineer 155. The extracted temporal specification can be used by the test engineer 155 in falsification. The extracted temporal specification, along with a compatibility score of the features, can be used to enhance the vehicle design and facilitate decision-making of the test engineer 155.

Example Processes

Figure 3:
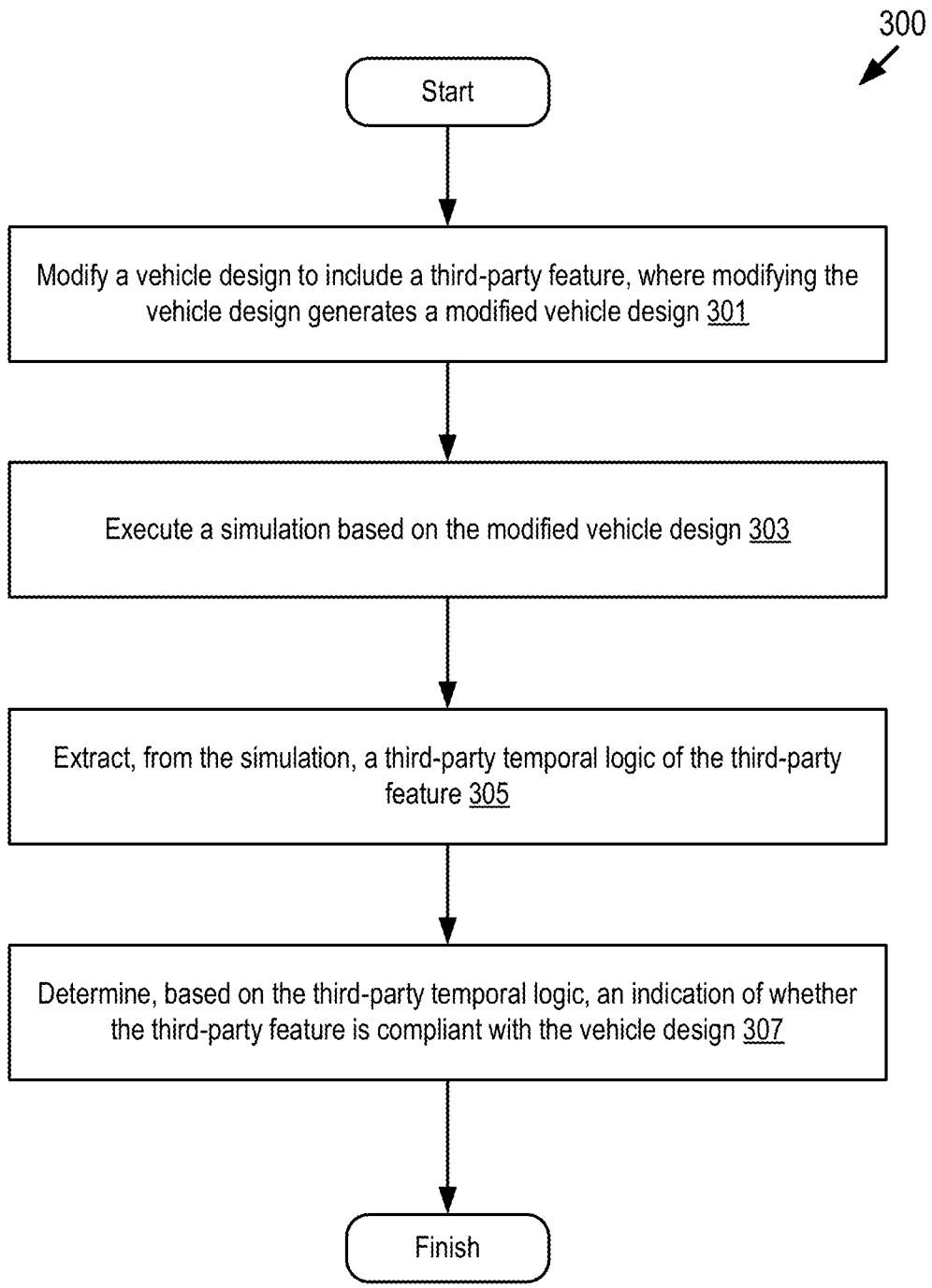
FIG. 3 depicts a method for testing a third-party feature for compatibility and integration with an OEM vehicle design according to some embodiments.

Referring now to FIG. 3, depicted is a flowchart of an example method 300 for testing a third-party feature for compatibility and integration with an OEM vehicle design according to some embodiments. The steps of the method 300 are executable in any order, and not necessarily the order depicted in FIG. 3.

At step 301, the simulator 159 modifies a vehicle design to include the third-party feature, where modifying the vehicle design generates a modified vehicle design.

For example, the vehicle design includes a design for an autonomous vehicle.

For example, the third-party feature includes a component of a vehicle whose design is described by the vehicle design. For example, the component includes an ADAS system, a vehicle safety system, or an autonomous driving system.

At step 303, the simulator 159 executes a simulation based on the modified vehicle design. For example, the simulation includes a virtualized version of a vehicle consistent with the modified vehicle design.

At step 305, the temporal logic generator 163 extracts, from the simulation, a third-party temporal logic of the third-party feature.

At step 307, the compatibility module 167 determines, based on the third-party temporal logic, an indication of whether the third-party feature is compliant with the vehicle design.

Figure 4:
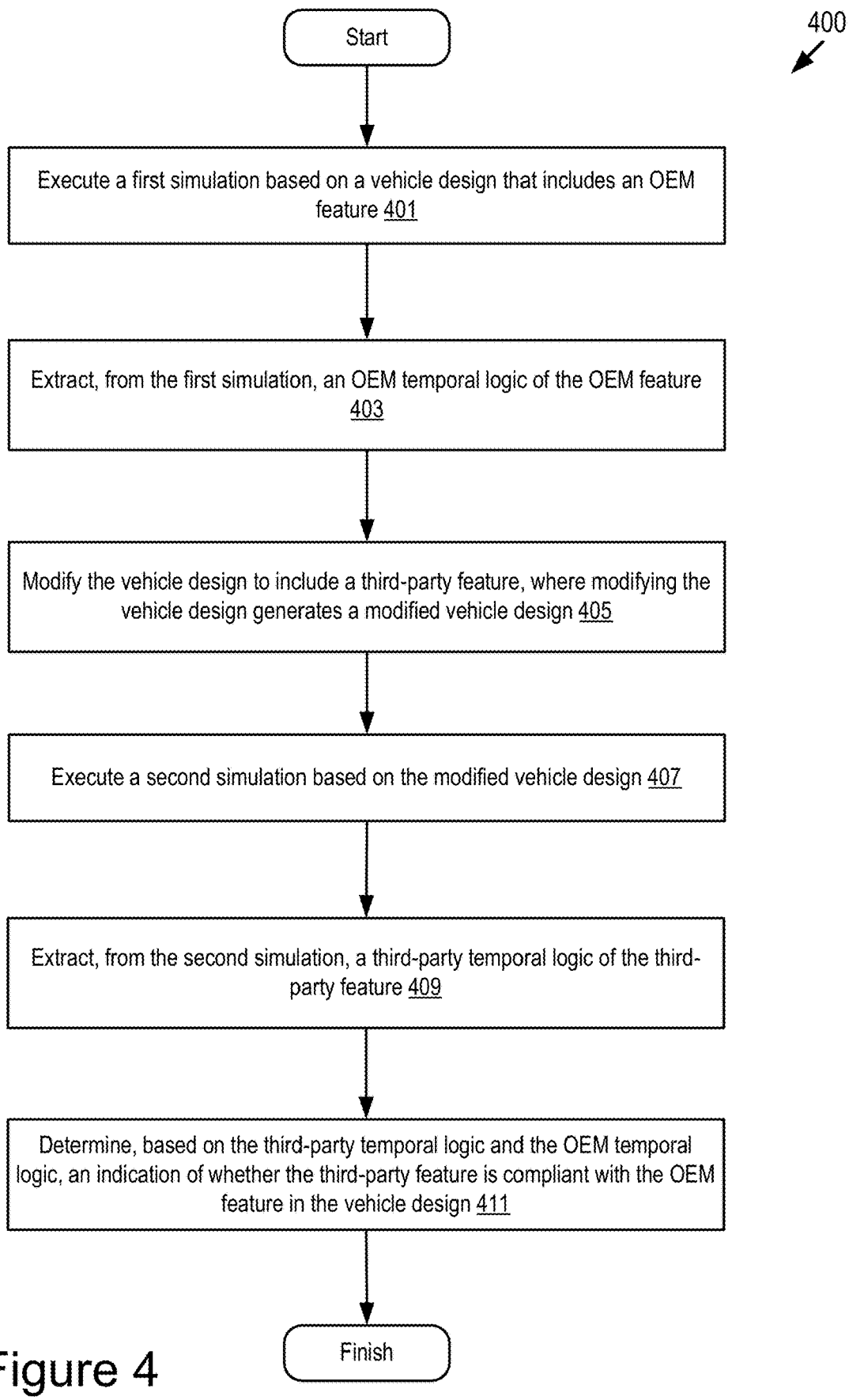
FIG. 4 depicts another method for testing a third-party feature for compatibility and integration with an OEM vehicle design according to some embodiments.

FIG. 4 depicts another method 400 for testing a third-party feature for compatibility and integration with an OEM vehicle design according to some embodiments. The steps of the method 400 are executable in any order, and not necessarily the order depicted in FIG. 4.

At step 401, the simulator 159 executes a first simulation based on a vehicle design that includes an OEM feature.

At step 403, the temporal logic generator 163 extracts, from the first simulation, an OEM temporal logic of the OEM feature.

At step 405, the simulator 159 modifies the vehicle design to include a third-party feature, where modifying the vehicle design generates a modified vehicle design.

At step 407, the simulator 159 executes a second simulation based on the modified vehicle design.

At step 409, the temporal logic generator 163 extracts, from the second simulation, a third-party temporal logic of the third-party feature.

At step 411, the compatibility module 167 determines, based on the third-party temporal logic and the OEM temporal logic, an indication of whether the third-party feature is compliant with the OEM feature in the vehicle design.

Figure 5A:
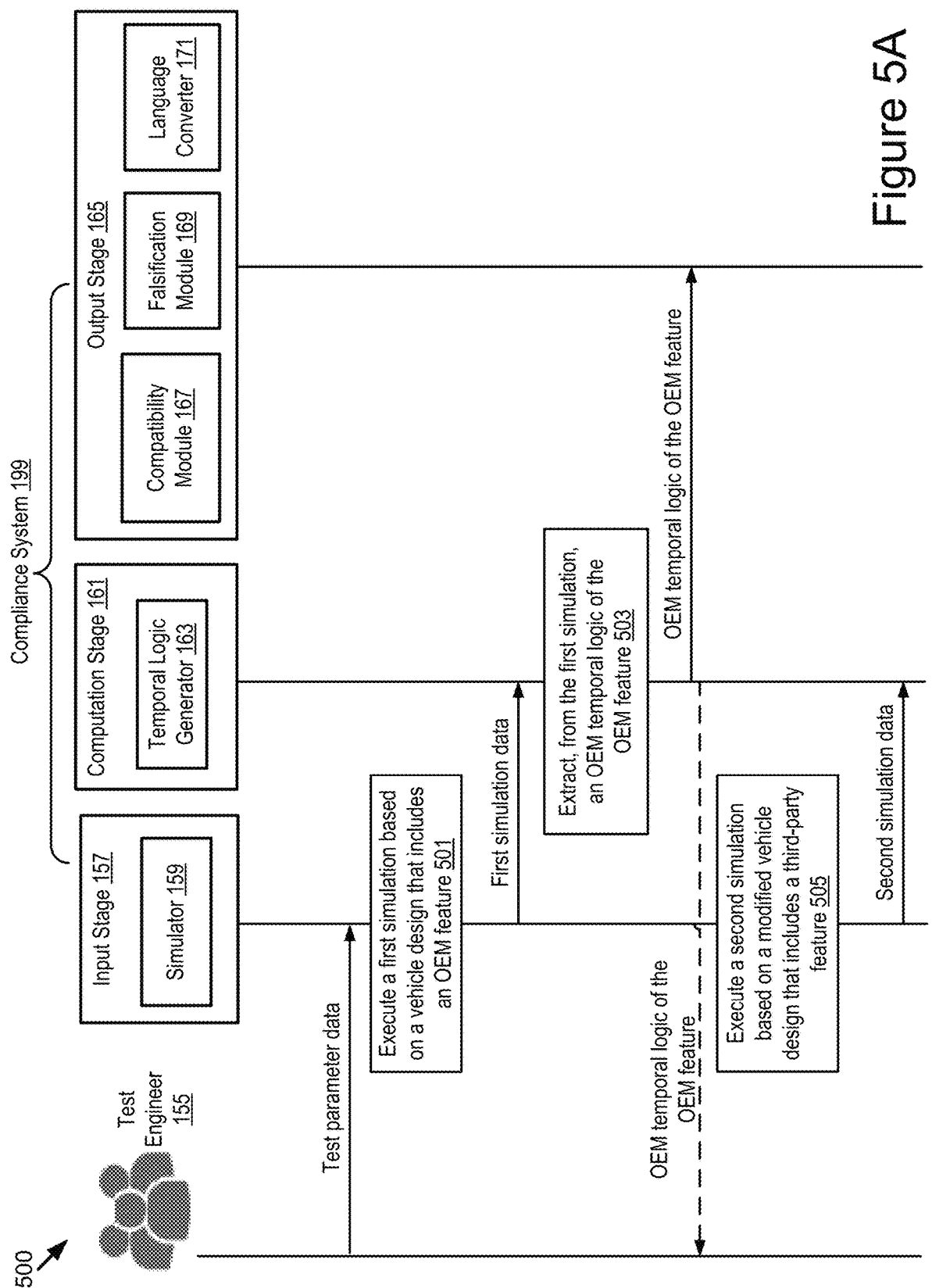
FIGS. 5A-5B depict an operational sequence for testing a third-party feature for compatibility and integration with an OEM vehicle design according to some embodiments.
Figure 5B:
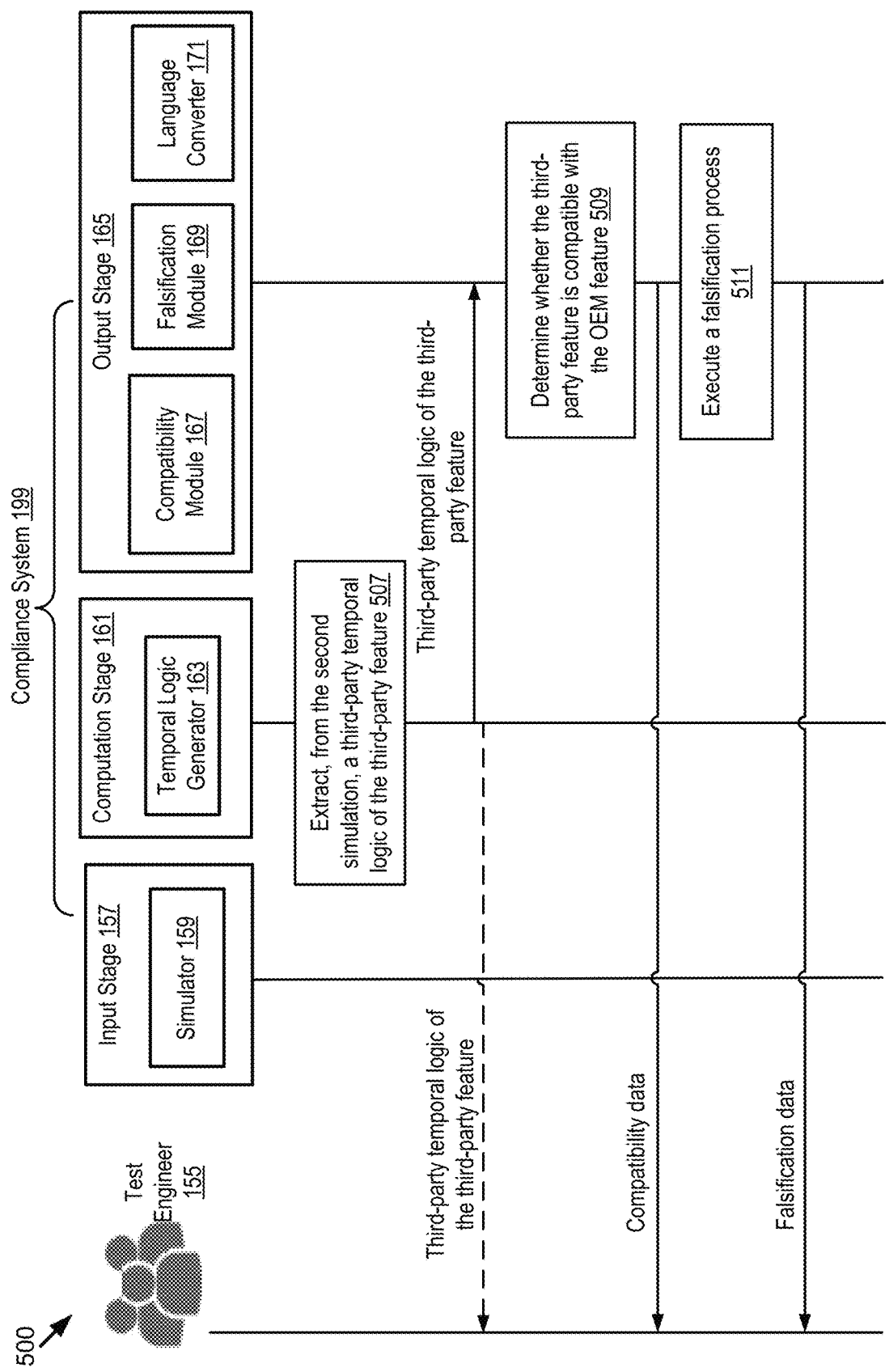

FIGS. 5A-5B depict an operational sequence 500 for testing a third-party feature for compatibility and integration with an OEM vehicle design according to some embodiments. The steps of the operational sequence 500 are executable in any order, and not necessarily the order depicted in FIGS. 5A-5B.

Referring to FIG. 5A, the test engineer 155 specifies test parameter data via the user interaction interface 123. The test parameter data is sent to the simulator 159.

At step 501, the simulator 159 executes a first simulation based on a vehicle design that includes the OEM feature. The simulator 159 generates first simulation data for the OEM feature and sends the first simulation data to the temporal logic generator 163.

At step 503, the temporal logic generator 163 extracts, from the first simulation, an OEM temporal logic of the OEM feature. The temporal logic generator 163 sends the OEM temporal logic to the compatibility module 167. Optionally, the temporal logic generator 163 sends the OEM temporal logic to the user device 120 for presentation to the test engineer 155.

At step 505, the simulator 159 executes a second simulation based on a modified vehicle design that includes the third-party feature. The simulator 159 generates second simulation data for the third-party feature and sends the second simulation data to the temporal logic generator 163.

Referring to FIG. 5B, at step 507, the temporal logic generator 163 extracts, from the second simulation, a third-party temporal logic of the third-party feature. The temporal logic generator 163 sends the third-party temporal logic to the compatibility module 167. Optionally, the temporal logic generator 163 sends the third-party temporal logic to the user device 120 for presentation to the test engineer 155.

At step 509, the compatibility module 167 determines whether the third-party feature is compatible with the OEM feature. The compatibility module 167 generates compatibility data describing a compatibility score and sends the compatibility data to the user device 120 for presentation to the test engineer 155.

At step 511, the falsification module 169 executes a falsification process for the OEM feature, the third-party feature, or a combination thereof. The falsification module 169 generates falsification data describing a result from the falsification process and sends the falsification data to the user device 120 for representation to the test engineer 155.

Figure 6:
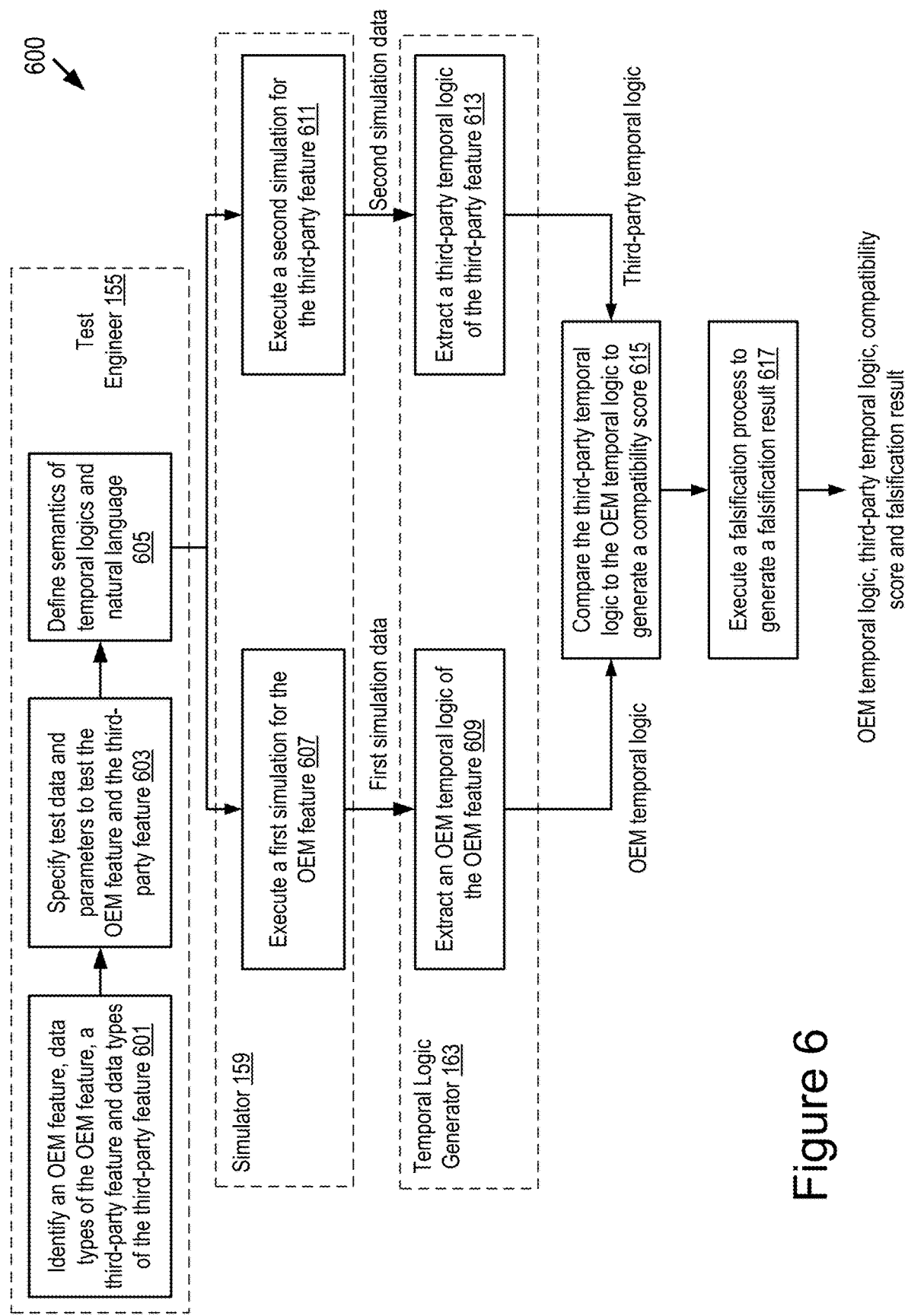
FIG. 6 depicts a flowchart for testing a third-party feature for compatibility and integration with an OEM vehicle design according to some embodiments.

FIG. 6 depicts a flowchart 600 for testing a third-party feature for compatibility and integration with an OEM vehicle design according to some embodiments. The steps of the flowchart 600 are executable in any order, and not necessarily the order depicted in FIG. 6.

At step 601, the test engineer 155 identifies an OEM feature, data types of the OEM feature, a third-party feature, and data types of the third-party feature.

At step 603, the test engineer 155 specifies test data and parameters to test the OEM feature and the third-party feature.

At step 605, the test engineer 155 defines semantics of temporal logics and natural language.

At step 607, the simulator 159 executes a first simulation for the OEM feature and generates first simulation data.

At step 609, the temporal logic generator 163 extracts an OEM temporal logic of the OEM feature based on the first simulation data.

At step 611, the simulator 159 executes a second simulation for the third-party feature and generates second simulation data for the third-party feature.

At step 613, the temporal logic generator 163 extracts a third-party temporal logic of the third-party feature.

At step 615, the compatibility module 167 compares the third-party temporal logic to the OEM temporal logic to generate a compatibility score.

At step 617, the falsification module 169 executes a falsification process for the OEM feature, the third-party feature, or a combination thereof to generate a falsification result.

Then, the OEM temporal logic, the third-party temporal logic, the compatibility score, and the falsification result are outputted to the user device 120 for presentation to the test engineer 155.

FIGS. 8A-8D depict example simulation data for an OEM feature and three third-party features respectively according to some embodiments. The OEM feature and the three third-party features are cruise control features. To run the simulations for these features, the test engineer 155 sets an input velocity range with an interval of [0, 10] meters/second (m/s), a time interval of 20 seconds, and a set of simulations for each feature to be 5 simulations.

For each feature, the simulator 159 uses the Breach simulation tool shown in Table 2 to generate 5 output results from the 5 simulations respectively. For each output result, the simulator 159 applies a piece-wise line-fitting algorithm as the curve approximation mechanism to select an optimal or minimum number of lines by statistically analyzing the output result.

Figure 8A:
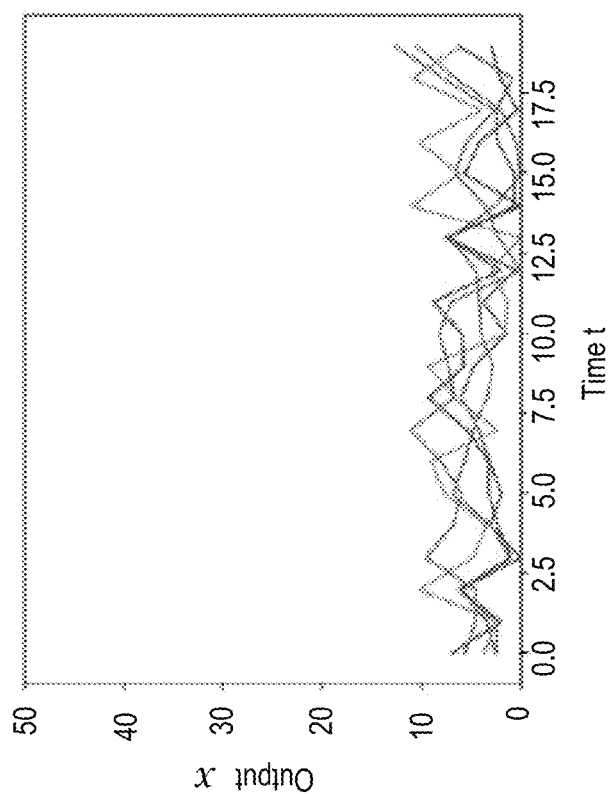
FIGS. 8A-8D depict example simulation data for an OEM feature and three third-party features respectively according to some embodiments.
Figure 8B:
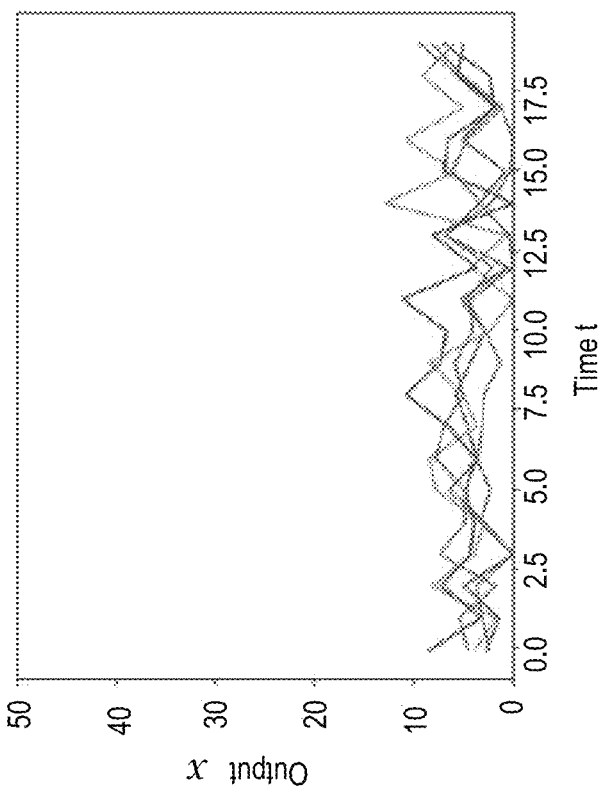
Figure 8D:
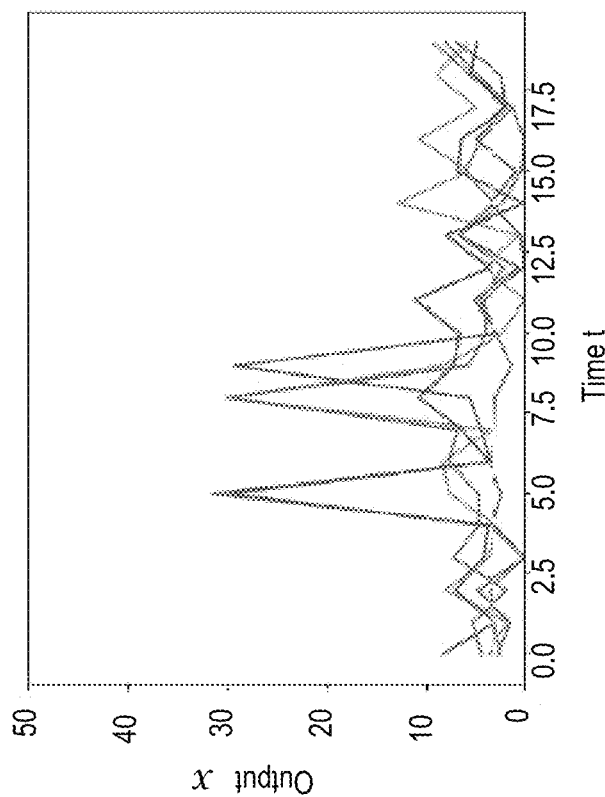
Figure 8C:
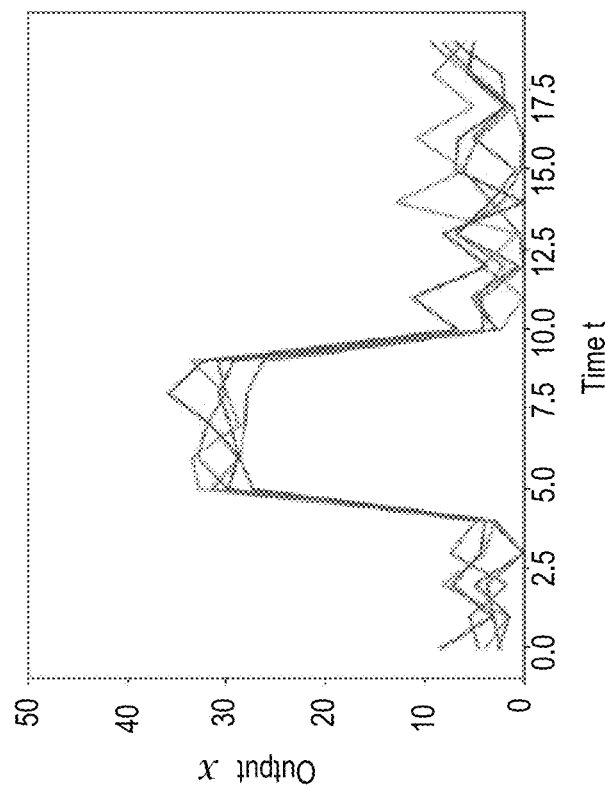

For example, first output results from the 5 simulations for the OEM feature are depicted in FIG. 8A by applying the curve approximation mechanism. Second output results from the 5 simulations for a first third-party feature are depicted in FIG. 8B by applying the curve approximation mechanism. Third output results from the 5 simulations for a second third-party feature are depicted in FIG. 8C by applying the curve approximation mechanism. Fourth output results from the 5 simulations for a third third-party feature are depicted in FIG. 8D by applying the curve approximation mechanism.

The temporal logic generator 163 may obtain the following atomic predicates for the OEM feature and the three third-party features based on the output results depicted in FIGS. 8A-8D, respectively:

FIGS. 8A and 8B (the OEM feature and the first third-party feature): (i) x<13, t=[0, 20] and (ii) x>=0, t=[0, 20];

FIG. 8C (the second third-party feature): (i) x<10, t=[0, 5], (ii) x>26, t=[5, 9], (iii) x<15, t=[9, 20] and (iv) x>=0, t=[0, 20]; and FIG. 8D (the third third-party feature): (i) x<15, t=[0, 20], (ii) x>28, t=[5, 9] and (iii) x>=0, t=[0, 20], where "x" is used to represent the output in the figures.

With respect to a particular feature, based on corresponding atomic predicates for the feature, the temporal logic generator 163 may use an exhaustive search mechanism to obtain all the possible candidate temporal logics for the feature. For example, the temporal logic generator 163 applies one or more temporal-logic operators to the corresponding atomic predicates to obtain all the possible candidate temporal logics for the feature. The temporal logic generator 163 generates a robustness measurement (e.g., an average robustness value of all the robustness values) with respect to each candidate temporal logic. The temporal logic generator 163 extracts a temporal logic for the feature as a candidate temporal logic with a maximum robustness measurement (e.g., a maximum average robustness value).

By performing operations similar to those described above for the OEM feature and the three third-party features respectively, the temporal logic generator 163 may extract temporal logics for the OEM feature and the three third-party features. These temporal logics are as follows:

FIGS. 8A and 8B (the OEM feature and the first third-party feature): $G\_[0, 20]\ ((x(t)<13) \wedge (x(t)>=0))$, which means that the output does not exceed 13 m/s at any point of the time interval [0, 20] and is also not negative;

FIG. 8C (the second third-party feature): $G\_[5, 9]\ (x(t)>26)$, which means that the output is greater than 26 m/s at each time step from a time t=5 s to a time t=9 s; and FIG. 8D (the third third-party feature): $F\_[5, 9]\ (x(t)>26)$, which means that the output is greater than 26 m/s for at least one-time step from t=5 s to t=9 s. In other words, there is at least one-time step in the time interval [5 s, 9 s] where the output exceeds 26 m/s.

The compatibility module 167 determines that the OEM feature and the first third-party feature have the same temporal logic, which indicates that the first third-party feature has a 100% compatibility with the OEM feature. The compatibility module 167 also determines that the second and third third-party features are incompatible with the OEM feature because their corresponding temporal logics are different from the temporal logic of the OEM feature.

In the above description, for purposes of explanation, numerous specific details are set forth in order to provide a thorough understanding of the specification. It will be apparent, however, to one skilled in the art that the disclosure can be practiced without these specific details. In some instances, structures and devices are shown in block diagram form in order to avoid obscuring the description. For example, the present embodiments can be described above primarily with reference to user interfaces and particular hardware. However, the present embodiments can apply to any type of computer system that can receive data and commands, and any peripheral devices providing services.

Reference in the specification to "some embodiments" or "some instances" means that a particular feature, structure, or characteristic described in connection with the embodiments or instances can be included in at least one embodiment of the description. The appearances of the phrase "in some embodiments" in various places in the specification are not necessarily all referring to the same embodiments.

Some portions of the detailed descriptions that follow are presented in terms of algorithms and symbolic representations of operations on data bits within a computer memory. These algorithmic descriptions and representations are the means used by those skilled in the data processing arts to most effectively convey the substance of their work to others skilled in the art. An algorithm is here, and generally, conceived to be a self-consistent sequence of steps leading to a desired result. The steps are those requiring physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the following discussion, it is appreciated that throughout the description, discussions utilizing terms including "processing" or "computing" or "calculating" or "determining" or "displaying" or the like, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission, or display devices.

The present embodiments of the specification can also relate to an apparatus for performing the operations herein. This apparatus may be specially constructed for the required purposes, or it may include a general-purpose computer selectively activated or reconfigured by a computer program stored in the computer. Such a computer program may be stored in a computer-readable storage medium, including, but is not limited to, any type of disk including floppy disks, optical disks, CD-ROMs, and magnetic disks, read-only memories (ROMs), random access memories (RAMs), EPROMs, EEPROMs, magnetic or optical cards, flash memories including USB keys with non-volatile memory, or any type of media suitable for storing electronic instructions, each coupled to a computer system bus.

The specification can take the form of some entirely hardware embodiments, some entirely software embodiments or some embodiments containing both hardware and software elements. In some preferred embodiments, the specification is implemented in software, which includes, but is not limited to, firmware, resident software, microcode, etc.

Furthermore, the description can take the form of a computer program product accessible from a computer-usable or computer-readable medium providing program code for use by or in connection with a computer or any instruction execution system. For the purposes of this description, a computer-usable or computer-readable medium can be any apparatus that can contain, store, communicate, propagate, or transport the program for use by or in connection with the instruction execution system, apparatus, or device.

A data processing system suitable for storing or executing program code will include at least one processor coupled directly or indirectly to memory elements through a system bus. The memory elements can include local memory employed during actual execution of the program code, bulk storage, and cache memories which provide temporary storage of at least some program code in order to reduce the number of times code must be retrieved from bulk storage during execution.

Input/output or I/O devices (including, but not limited to, keyboards, displays, pointing devices, etc.) can be coupled to the system either directly or through intervening I/O controllers.

Network adapters may also be coupled to the system to enable the data processing system to become coupled to other data processing systems or remote printers or storage devices through intervening private or public networks. Modems, cable modem, and Ethernet cards are just a few of the currently available types of network adapters.

Finally, the algorithms and displays presented herein are not inherently related to any particular computer or other apparatus. Various general-purpose systems may be used with programs in accordance with the teachings herein, or it may prove convenient to construct more specialized apparatus to perform the required method steps. The required structure for a variety of these systems will appear from the description below. In addition, the specification is not described with reference to any particular programming language. It will be appreciated that a variety of programming languages may be used to implement the teachings of the specification as described herein.

The foregoing description of the embodiments of the specification has been presented for the purposes of illustration and description. It is not intended to be exhaustive or to limit the specification to the precise form disclosed. Many modifications and variations are possible in light of the above teaching. It is intended that the scope of the disclosure be limited not by this detailed description, but rather by the claims of this application. As will be understood by those familiar with the art, the specification may be embodied in other specific forms without departing from the spirit or essential characteristics thereof. Likewise, the particular naming and division of the modules, routines, features, attributes, methodologies, and other aspects are not mandatory or significant, and the mechanisms that implement the specification or its features may have different names, divisions, or formats. Furthermore, as will be apparent to one of ordinary skill in the relevant art, the modules, routines, features, attributes, methodologies, and other aspects of the disclosure can be implemented as software, hardware, firmware, or any combination of the three. Also, wherever a component, an example of which is a module, of the specification is implemented as software, the component can be implemented as a standalone program, as part of a larger program, as a plurality of separate programs, as a statically or dynamically linked library, as a kernel-loadable module, as a device driver, or in every and any other way known now or in the future to those of ordinary skill in the art of computer programming. Additionally, the disclosure is in no way limited to embodiment in any specific programming language, or for any specific operating system or environment. Accordingly, the disclosure is intended to be illustrative, but not limiting, of the scope of the specification, which is set forth in the following claims.

What is claimed is:

1. A computer program product comprising a non-transitory memory of a computer system storing computer-executable code that, when executed by a processor, causes the processor to:
   execute a first simulation, based on a vehicle design that includes an Original Equipment Manufacturer (OEM) feature, to generate first simulation data;
   extract, from the first simulation data, an OEM temporal logic of the OEM feature;
   modify the vehicle design to include a third-party feature, wherein modifying the vehicle design generates a modified vehicle design;
   execute a second simulation, based on the modified vehicle design, to generate second simulation data;
   extract, from the second simulation data, a third-party temporal logic of the third-party feature, wherein the processor determines a temporal specification for the third-party feature based on the second simulation data when the temporal specification is unknown prior to executing the second simulation;
   perform a falsification process to generate falsification data based on one or more of the OEM feature and the third-party feature; and
   determine, based on the third-party temporal logic and the OEM temporal logic, an indication of whether the third-party feature is compliant with the OEM feature in the vehicle design.

2. The computer program product of claim 1, wherein the temporal specification is unspecified prior to executing the second simulation and the temporal specification is estimated by the processor based on the second simulation data and the temporal specification is described by the processor in a formal language without manual annotation.

3. The computer program product of claim 2, wherein the temporal specification includes estimated values for parameters in the temporal specification which are determined by the processor based on statistical analysis.

4. The computer program product of claim 1, wherein the third-party feature includes a component of a vehicle whose design is described by the vehicle design.

5. A method comprising:
   executing a first simulation, based on a vehicle design that includes an Original Equipment Manufacturer (OEM) feature, to generate first simulation data;
   extracting, from the first simulation data, an OEM temporal logic of the OEM feature;
   modifying a vehicle design to include a third-party feature, wherein modifying the vehicle design generates a modified vehicle design;
   executing a second simulation, based on the modified vehicle design, to generate simulation data;
   extracting, from the simulation data, a third-party temporal logic of the third-party feature, wherein a processor determines a temporal specification for the third-party feature based on the second simulation data when the temporal specification is unknown prior to executing the second simulation;
   performing a falsification process to generate falsification data based on one or more of the OEM feature and the third-party feature; and
   determining, based on the falsification data and the third-party temporal logic, an indication of whether the third-party feature is compliant with the vehicle design.

6. The method of claim 5, wherein the vehicle design includes a design for an autonomous vehicle.

7. The method of claim 5, wherein the simulation includes a virtualized version of a vehicle consistent with the modified vehicle design.

8. The method of claim 5, wherein the third-party feature includes a component of a vehicle whose design is described by the vehicle design.

9. The method of claim 8, wherein the component includes an Advanced Driver Assistance System.

10. The method of claim 8, wherein the component includes a vehicle safety system.

11. The method of claim 8, wherein the component includes an autonomous driving system.

12. The method of claim 5, wherein determining, based on the third-party temporal logic, the indication of whether the third-party feature is compliant with the vehicle design comprises:
   determining whether the third-party temporal logic is compatible with an Original Equipment Manufacturer (OEM) temporal logic of an OEM feature included in the vehicle design; and
   responsive to determining that the third-party temporal logic is compatible with the OEM temporal logic, generating the indication indicating that the third-party feature is compliant with the OEM feature.

13. A system comprising:
   a computer system including a non-transitory memory storing computer code which, when executed by the computer system, causes the computer system to:
      execute a first simulation, based on a vehicle design that includes an Original Equipment Manufacturer (OEM) feature, to generate first simulation data;
      extract, from the first simulation data, an OEM temporal logic of the OEM feature;

modify a vehicle design to include a third-party feature, wherein modifying the vehicle design generates a modified vehicle design;

execute a second simulation, based on the modified vehicle design, to generate simulation data;

extract, from the simulation data, a third-party temporal logic of the third-party feature, wherein a processor determines a temporal specification for the third-party feature based on the second simulation data when the temporal specification is unknown prior to executing the second simulation;

perform a falsification process to generate falsification data based on one or more of an OEM feature and the third-party feature; and determine, based on at least one of the falsification data and the third-party temporal logic, an indication of whether the third-party feature is compliant with the vehicle design.

14. The system of claim 13, wherein the vehicle design includes a design for an autonomous vehicle.

15. The system of claim 13, wherein the simulation includes a virtualized version of a vehicle consistent with the modified vehicle design.

16. The system of claim 13, wherein the third-party feature includes a component of a vehicle whose design is described by the vehicle design.

17. The system of claim 16, wherein the component includes an Advanced Driver Assistance System.

18. The system of claim 16, wherein the component includes a vehicle safety system.

19. The system of claim 16, wherein the component includes an autonomous driving system.

20. The system of claim 13, wherein the computer code, when executed by the computer system, causes the computer system to determine, based on the third-party temporal logic, the indication of whether the third-party feature is compliant with the vehicle design at least by:

determining whether the third-party temporal logic is compatible with an Original Equipment Manufacturer (OEM) temporal logic of an OEM feature included in the vehicle design; and responsive to determining that the third-party temporal logic is compatible with the OEM temporal logic, generating the indication indicating that the third-party feature is compliant with the OEM feature.

* * * * *